(12) United States Patent
Yasumatsu et al.

(10) Patent No.: US 11,156,909 B2
(45) Date of Patent: Oct. 26, 2021

(54) WAVELENGTH CONVERTER, LIGHT SOURCE APPARATUS, AND PROJECTOR

(71) Applicant: SEIKO EPSON CORPORATION, Tokyo (JP)

(72) Inventors: Wataru Yasumatsu, Azumino (JP); Osamu Arakawa, Shiojiri (JP); Tomohiro Yokoo, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 16/910,191

(22) Filed: Jun. 24, 2020

(65) Prior Publication Data

US 2020/0409248 A1 Dec. 31, 2020

(30) Foreign Application Priority Data

Jun. 25, 2019 (JP) .............................. JP2019-116916

(51) Int. Cl.
*G03B 21/20* (2006.01)
*H04N 9/31* (2006.01)
*H01L 33/50* (2010.01)

(52) U.S. Cl.
CPC ....... *G03B 21/204* (2013.01); *G03B 21/2013* (2013.01); *G03B 21/2066* (2013.01); *H01L 33/501* (2013.01); *H04N 9/3161* (2013.01); *H04N 9/3164* (2013.01)

(58) Field of Classification Search
CPC .............. G03B 21/204; G03B 21/2013; G03B 21/2066; H01L 33/501; H04N 9/3161; H04N 9/3164

USPC ............................................................ 353/31
See application file for complete search history.

(56) References Cited

U.S. PATENT DOCUMENTS

| | | | | |
|---|---|---|---|---|
| 2012/0154767 | A1* | 6/2012 | Kimura | G03B 21/204 353/98 |
| 2014/0153276 | A1 | 6/2014 | Nozaki | |
| 2016/0377968 | A1 | 12/2016 | Yasumatsu | |
| 2017/0137706 | A1* | 5/2017 | Fujita | F21K 9/64 |

(Continued)

FOREIGN PATENT DOCUMENTS

| | | |
|---|---|---|
| JP | 2014-110173 A | 6/2014 |
| JP | 2016-027613 A | 2/2016 |

(Continued)

*Primary Examiner* — Jerry L Brooks
(74) *Attorney, Agent, or Firm* — Oliff PLC

(57) ABSTRACT

A wavelength converter according to the present disclosure includes a wavelength conversion layer that has a first surface and a second surface different from the first surface and converts excitation light that belongs to a first wavelength band into fluorescence that belongs to a second wavelength band different from the first wavelength band, a first light transmissive member that has a third surface on which the excitation light is incident and a fourth surface different from the third surface and transmits at least the excitation light, and a first layer provided between the first surface of the wavelength conversion layer and the fourth surface of the first light transmissive member, which are surfaces facing each other. The refractive index of the first light transmissive member is greater than the refractive index of the wavelength conversion layer, and the first layer transmits the excitation light and reflects the fluorescence.

18 Claims, 11 Drawing Sheets

(56) References Cited

U.S. PATENT DOCUMENTS

2019/0097095 A1* 3/2019 Yamanaka ............... F21S 41/16
2019/0195484 A1 6/2019 Yamana et al.

FOREIGN PATENT DOCUMENTS

| JP | 2016-099566 A | 5/2016 |
| JP | 2017-009823 A | 1/2017 |
| WO | 2018/056157 A1 | 3/2018 |

* cited by examiner

WAVELENGTH CONVERTER, LIGHT SOURCE APPARATUS, AND PROJECTOR

The present application is based on, and claims priority from JP application Serial Number 2019-116916, filed Jun. 25, 2019, the disclosure of which is hereby incorporated by reference herein in its entirety.

BACKGROUND

1. Technical Field

The present disclosure relates to a wavelength converter, a light source apparatus, and a projector.

2. Related Art

As a light source apparatus used in a projector, there has been a proposed light source apparatus that uses fluorescence emitted from a phosphor irradiated with excitation light outputted from a light source. WO 2018/056157 discloses an illumination apparatus including a first substrate and a second substrate that transmit light, a phosphor layer provided between the first substrate and the second substrate, and a heat dissipation plate so provided as to be in contact with the first and second substrates.

In the illumination apparatus described in WO 2018/056157, part of fluorescence produced in the phosphor layer enters the first substrate so disposed as to face an excitation light incident surface of the phosphor layer so that the fluorescence cannot be extracted from the second substrate. The illumination apparatus therefore has a problem of a decrease in fluorescence use efficiency. Further, the fluorescence produced in the phosphor layer has a Lambert light orientation distribution, which means a large etendue, resulting in a problem of a decrease in the light use efficiency.

SUMMARY

A wavelength converter according to an aspect of the present disclosure includes a wavelength conversion layer that has a first surface and a second surface different from the first surface and converts excitation light that belongs to a first wavelength band into fluorescence that belongs to a second wavelength band different from the first wavelength band, a first light transmissive member that has a third surface on which the excitation light is incident and a fourth surface different from the third surface and transmits at least the excitation light, and a first layer provided between the first surface of the wavelength conversion layer and the fourth surface of the first light transmissive member, which are surfaces facing each other. A refractive index of the first light transmissive member is greater than a refractive index of the wavelength conversion layer, and the first layer transmits the excitation light and reflects the fluorescence.

The wavelength converter according to the aspect of the present disclosure may further include a second layer so provided as to face the third surface of the first light transmissive member, and the second layer may transmit the excitation light and reflect the fluorescence.

The wavelength converter according to the aspect of the present disclosure may further include a reflection layer. The wavelength conversion layer may have a first side surface that intersects the first surface and the second surface. The first light transmissive member may have a second side surface that intersects the third surface and the fourth surface. The reflection layer may be so provided as to face the first side surface and the second side surface and reflect at least the fluorescence.

The wavelength converter according to the aspect of the present disclosure may further include a first heat dissipation member and a second heat dissipation member. The reflection layer may be provided between the first heat dissipation member and the first side surface of the wavelength conversion layer. The second heat dissipation member may be provided between the first heat dissipation member and the second side surface of the first heat dissipation member. The reflection layer may be provided between the first heat dissipation member and the second side surface of the first light transmissive member.

The wavelength converter according to the aspect of the present disclosure may further include a second light transmissive member that has a fifth surface and a third side surface that intersects the fifth surface and transmits at least the fluorescence. The second surface of the wavelength conversion layer and the fifth surface of the second light transmissive member may be so provided as to face each other. A third heat dissipation member may be provided between the first heat dissipation member and the third side surface of the second heat dissipation member. The reflection layer may be provided between the first heat dissipation member and the third side surface of the second light transmissive member.

In the wavelength converter according to the aspect of the present disclosure, thermal conductivity of the second light transmissive member may be greater than thermal conductivity of the wavelength conversion layer.

In the wavelength converter according to the aspect of the present disclosure, the first light transmissive member may contain silicon carbide.

In the wavelength converter according to the aspect of the present disclosure, thermal conductivity of the first light transmissive member may be greater than thermal conductivity of the wavelength conversion layer.

In the wavelength converter according to the aspect of the present disclosure, the second light transmissive member may contain silicon carbide.

A light source apparatus according to another aspect of the present disclosure includes the wavelength converter according to the aspect of the present disclosure and a light source that outputs the excitation light toward the third surface of the first light transmissive member of the wavelength converter.

A projector according to another aspect of the present disclosure includes the light source apparatus according to the aspect of the present disclosure, a light modulator that modulates light from the light source apparatus in accordance with image information, and a projection optical apparatus that projects the light modulated by the light modulator.

DESCRIPTION OF EXEMPLARY EMBODIMENTS

First Embodiment

A first embodiment of the present disclosure will be described below with reference to FIGS. 1 to 4.

In the following drawings, components are drawn at different dimensional scales in some cases for clarity of each of the components.

An example of a projector according to the present embodiment will be descried.

Figure 1:
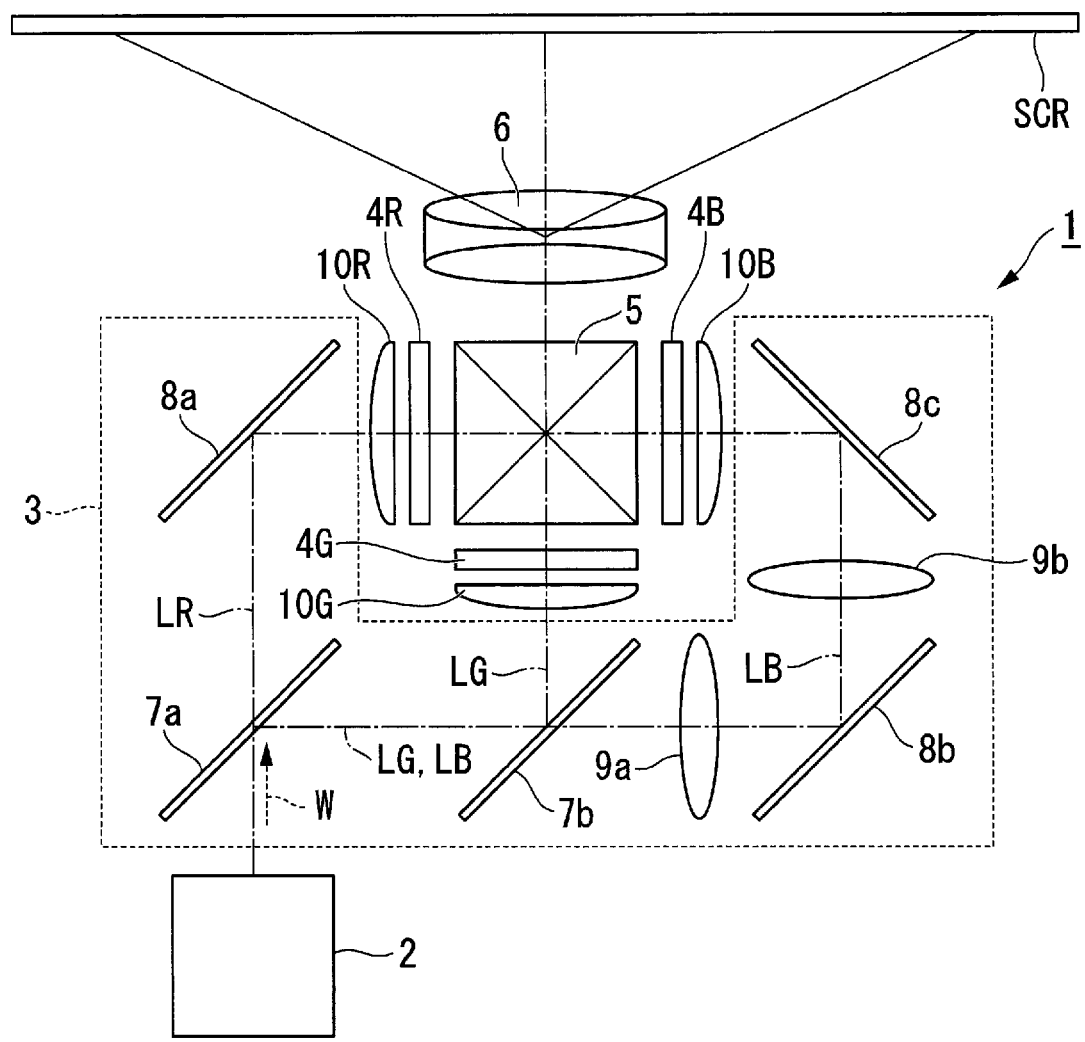
FIG. 1 is a schematic configuration diagram of a projector according to a first embodiment.

FIG. 1 shows a schematic configuration of a projector 1 according to the present embodiment.

The projector 1 according to the present embodiment is a projection-type image display apparatus that displays color video images on a screen SCR, as shown in FIG. 1. The projector 1 includes an illumination apparatus 2, a color separation system 3, a light modulator 4R, a light modulator 4G, a light modulator 4B, a light combining system 5, and a projection optical apparatus 6. The configuration of the illumination apparatus 2 will be described later.

The color separation system 3 includes a first dichroic mirror 7a, a second dichroic mirror 7b, a reflection mirror 8a, a reflection mirror 8b, a reflection mirror 8c, a relay lens 9a, and a relay lens 9b. The color separation system 3 separates illumination light W outputted from the illumination apparatus 2 into red light LR, green light LG, and blue light LB, guides the red light LR to the light modulator 4R, guides the green light LG to the light modulator 4G, and guides the blue light LB to the light modulator 4B.

A field lens 10R is disposed between the color separation system 3 and the light modulator 4R, substantially parallelizes the incident light, and causes the resultant light to travel toward the light modulator 4R. A field lens 10G is disposed between the color separation system 3 and the light modulator 4G, substantially parallelizes the incident light, and causes the resultant light to travel toward the light modulator 4G. A field lens 10B is disposed between the color separation system 3 and the light modulator 4B, substantially parallelizes the incident light, and causes the resultant light to travel toward the light modulator 4B.

The first dichroic mirror 7a transmits a red light component and reflects a green light component and a blue light component. The second dichroic mirror 7b reflects the green light component and transmits the blue light component. The reflection mirror 8a reflects the red light component. The reflection mirrors 8b and 8c reflect the blue light component.

The red light LR having passed through the first dichroic mirror 7a is reflected off the reflection mirror 8a, passes through the field lens 10R, and is incident on an image formation area of the light modulator 4R for red light. The green light LG reflected off the first dichroic mirror 7a is further reflected off the second dichroic mirror 7b, passes through the field lens 10G, and is incident on an image formation area of the light modulator 4G for green light. The blue light LB having passed through the second dichroic mirror 7b travels via the relay lens 9a, the light-incident-side reflection mirror 8b, the relay lens 9b, the light-exiting-side reflection mirror 8c, and the field lens 10B and is incident on an image formation area of the light modulator 4B for blue light.

The light modulators 4R, 4G, and 4B each modulate the color light incident thereon in accordance with image information to form an image light flux. The light modulators 4R, 4G, and 4B are each formed of a liquid crystal light valve. Although not shown, a light-incident-side polarizer is disposed on the light incident side of each of the light modulators 4R, 4G, and 4B. A light-exiting-side polarizer is disposed on the light exiting side of each of the light modulators 4R, 4G, and 4B.

The light combining system 5 combines the image light fluxes outputted from the light modulators 4R, 4G, and 4B with one another to form full-color image light. The light combining system 5 is formed of a cross dichroic prism formed of four right angled prisms so bonded to each other to form a substantially square shape in a plan view. Dielectric multilayer films are formed along the substantially X-letter-shaped interface between the right angled prisms bonded to each other.

The image light having exited out of the light combining system 5 is enlarged and projected by the projection optical apparatus 6 to form an image on the screen SCR. That is, the projection optical apparatus 6 projects the light fluxes modulated by the light modulators 4R, 4G, and 4B. The projection optical apparatus 6 is formed of a plurality of projection lenses.

An example of the illumination apparatus 2 in the present embodiment will be described.

Figure 2:
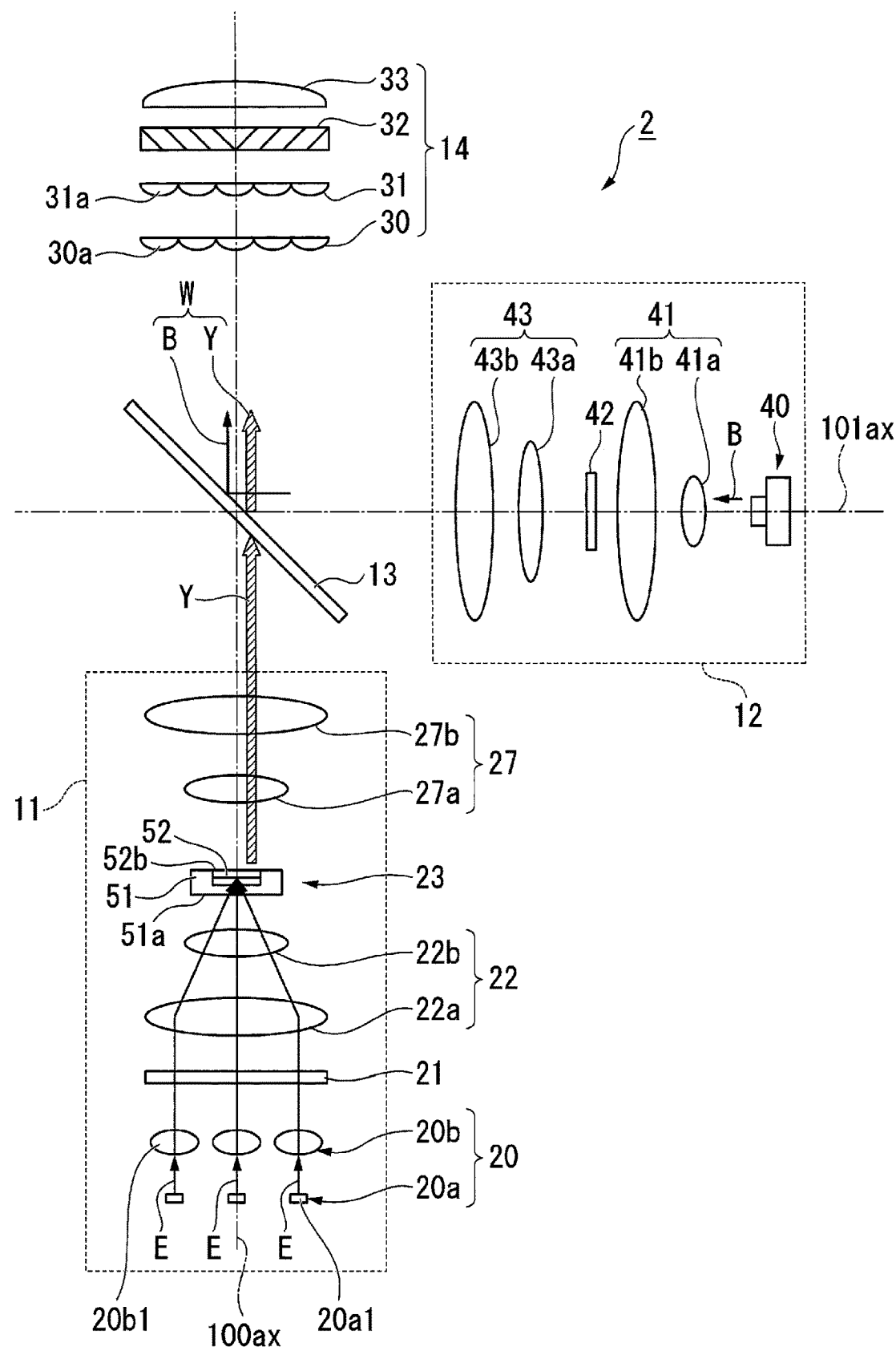
FIG. 2 is a schematic configuration diagram of an illumination apparatus.

FIG. 2 shows a schematic configuration of the illumination apparatus 2.

The illumination apparatus 2 includes a first light source apparatus 11, a second light source apparatus 12, a dichroic mirror 13, and a homogenizing illuminator 14, as shown in FIG. 2. The first light source apparatus 11 of the present embodiment corresponds to the "light source apparatus" in the appended claims.

The first light source apparatus 11 includes a first light source 20 (light source), a diffuser 21, a light collection system 22, a wavelength converter 23, and a pickup system 27. The first light source 20 outputs excitation light E toward a third surface 53a of a first light transmissive member 53 of the wavelength converter 23, which will be described later.

The first light source 20 includes a light source unit 20a and a collimator system 20b. The light source unit 20a is formed of a plurality of semiconductor lasers (excitation light source) 20a1, which each output the excitation light E, which is blue laser light that belongs to a first wavelength band. The wavelength at which the intensity of the emitted excitation light E peaks is, for example, 445 nm. The plurality of semiconductor lasers 20a1 are arranged in an array in a single plane perpendicular to an illumination optical axis 100ax. The semiconductor lasers 20a1 may instead output blue light having a peak wavelength other than 445 nm, for example, a peak wavelength of 455 nm or 460 nm.

The collimator system 20b is formed of a plurality of collimator lenses 20b1. The collimator lenses 20b1 are provided in correspondence with the semiconductor lasers 20a1 and arranged in an array in a single plane perpendicular to the illumination optical axis 100ax. The collimator lenses 20b1 each convert the excitation light E outputted from the corresponding semiconductor laser 20a1 into parallelized light.

The diffuser 21 diffuses the excitation light E outputted from the first light source 20. In the present embodiment, the diffuser 21 can be formed, for example, of a ground glass plate made of optical glass.

The light collection system 22 causes the excitation light E diffused by the diffuser 21 to converge and enter the wavelength converter 23. In the present embodiment, the light collection system 22 includes a first lens 22a and a second lens 22b, which are each formed, for example, of a convex lens. Employing the thus simply configured light collection system 22 allows reduction in cost of the first light source apparatus 11. The configuration of the wavelength converter 23 will be described later.

The pickup system 27 includes a first collimation lens 27a and a second collimation lens 27b. The pickup system 27 substantially parallelizes fluorescence Y emitted from the wavelength converter 23. The first collimation lens 27a and the second collimation lens 27b are each formed of a convex lens.

The fluorescence Y parallelized by the pickup system 27 is incident on the dichroic mirror 13. The dichroic mirror 13 is so disposed as to intersect at 45° an optical axis 101ax of the second light source apparatus 12 and the illumination optical axis 100ax of the illumination apparatus 2. The dichroic mirror 13 is so characterized as to transmit the fluorescence Y and reflect blue light B from the second light source apparatus 12.

The second light source apparatus 12 includes a second light source 40, a second light collection system 41, a scatter plate 42, and a second pickup system 43.

The second light source 40 has the same configuration as that of the first light source 20. In the present embodiment, the second light source 40 includes a semiconductor laser that outputs the blue light B and a collimator lens that parallelizes the blue light B outputted from the semiconductor laser. The second light source 40 only needs to include at least one semiconductor laser and at least one collimator lens or may include a plurality of semiconductor lasers and a plurality of collimator lenses, as does the first light source 20.

The second light collection system 41 includes a first lens 41a and a second lens 41b. The second light collection system 41 causes the blue light B outputted from the second light source 40 to converge at the vicinity of the scatter plate 42. The first lens 41a and the second lens 41b are each formed of a convex lens.

The scatter plate 42 scatters the blue light B having exited out of the second light collection system 41 to convert the blue light B into blue light B having a light orientation distribution similar to the light orientation distribution of the florescence Y produced in the first light source apparatus 11. The scatter plate 42 can be formed, for example, of a ground glass plate made of optical glass.

The second pickup system 43 includes a first lens 43a and a second lens 43b. The second pickup system 43 substantially parallelizes the light having exited out of the scatter plate 42. The first lens 43a and the second lens 43b are each formed of a convex lens.

In the present embodiment, the blue light B from the second light source apparatus 12 is reflected off the dichroic mirror 13. The blue light B reflected off the dichroic mirror 13 is combined with the florescence Y, which is yellow light and has been outputted from the first light source apparatus 11 and has passed through the dichroic mirror 13, into white light W. The white light W then enters the homogenizing illuminator 14.

The homogenizing illuminator 14 includes a first lens array 30, a second lens array 31, a polarization converter 32, and a superimposing lens 33.

The first lens array 30 includes a plurality of first lenslets 30a for dividing the light having exited out of the dichroic mirror 13 into a plurality of sub-light fluxes. The plurality of first lenslets 30a are arranged in a matrix in a plane perpendicular to the illumination optical axis 100ax.

The second lens array 31 includes a plurality of second lenslets 31a corresponding to the plurality of first lenslets 30a of the first lens array 30. The second lens array 31 along with the superimposing lens 33 forms images of the first lenslets 30a of the first lens array 30 in the vicinity of the image formation area of each of the light modulators 4R, 4G, and 4B. The plurality of second lenslets 31a are arranged in a matrix in a plane perpendicular to the illumination optical axis 100ax.

The polarization converter 32 has the function of aligning the polarization directions of the white light W with one another into one direction. The polarization converter 32 includes polarization separation films, retardation films, and mirrors. To align the polarization directions of the florescence Y, which is non-polarized light, with the polarization direction of the blue light B, that is, the polarization converter 32 converts one polarization light component into another polarization light component. The polarization converter 32 converts, for example, a P-polarized light component into an S-polarized light component.

The superimposing lens 33 causes the sub-light fluxes from the polarization converter 32 to converge and superimposes the sub-light fluxes with one another in the vicinity of the image formation area of each of the light modulators 4R, 4G, and 4B. The first lens array 30, the second lens array 31, and the superimposing lens 33 form an optical integration system that homogenizes the in-plane optical intensity distribution of the white light W.

The configuration of the wavelength converter 23 will next be described.

Figure 3:
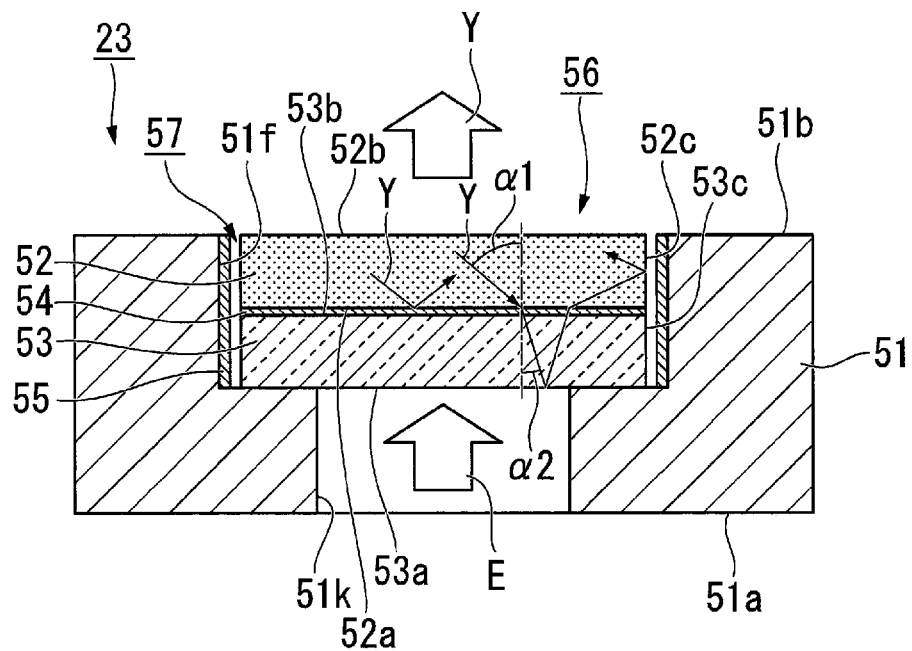
FIG. 3 is a cross-sectional view of a wavelength converter.

FIG. 3 is a cross-sectional view of the wavelength converter 23 in the present embodiment.

The wavelength converter 23 includes a first heat dissipation member 51, a wavelength conversion layer 52, a first light transmissive member 53, a first dichroic mirror (first layer), and a reflection layer 55, as shown in FIG. 3. The first light transmissive member 53, the first dichroic mirror 54, and the wavelength conversion layer 52 are stacked on each other in the presented order from the side on which the excitation light E is incident. The stack formed of the first light transmissive member 53, the first dichroic mirror 54, and the wavelength conversion layer 52 is hereinafter referred to as a wavelength conversion section 56.

The first heat dissipation member 51 has a first surface 51a and a second surface 51b different from the first surface 51a. The first surface 51a is provided with an opening 51k, which transmits the excitation light E. The second surface 51b is provided with a recess 51f so size as to be capable of accommodating the wavelength conversion section 56. The wavelength conversion section 56 is so supported that a circumferential edge portion of a third surface 53a of the first light transmissive member 53, which will be described later, is bonded to the bottom surface of the recess 51f. The first heat dissipation member 51 thus also functions as a support member that supports the wavelength conversion section 56. The first heat dissipation member 51 does not necessarily made of a specific material and is desirably made of a metal having high thermal conductivity, for example, copper or aluminum. The bottom surface of the recess 51f is provided with the opening 51k.

The wavelength conversion layer 52 has a first surface 52a, on which the excitation light E is incident, a second surface 52b, which differs from the first surface 52a, and a first side surface 52c, which intersects the first surface 52a and the second surface 52b. Assuming that the wavelength conversion layer 52 has a rectangular shape when viewed along a normal to the second surface 52b, the combination of all the four surfaces that intersect the first surface 52a and the second surface 52b is called the first side surface 52c. The wavelength conversion layer 52 contains a ceramic phosphor that converts the excitation light E, which belongs to the first wavelength band, into the florescence Y, which belongs to a second wavelength band different from the first wavelength band. The second wavelength band ranges, for example, from 490 to 750 nm, and the florescence Y is yellow light containing the green light component and the red light component. The wavelength conversion layer 52 may contain a single-crystal phosphor. The wavelength conversion layer 52 has, for example, a thickness of 100 μm.

The wavelength conversion layer 52 contains, for example, an yttrium-aluminum-garnet-based (YAG-based) phosphor. Consider YAG:Ce, which contains cerium (Ce) as an activator by way of example, and the wavelength conversion layer 52 can be made, for example, of a material produced by mixing raw powder materials containing $Y_2O_3$, $Al_2O_3$, $CeO_3$, and other constituent elements with one another and causes the mixture to undergo a solid-phase reaction, Y—Al—O amorphous particles produced by using a coprecipitation method, a sol-gel method, or any other wet method, or YAG particles produced by using a spray-drying method, a flame-based thermal decomposition method, or a thermal plasma method or any other gas-phase method.

The first light transmissive member 53 has a third surface 53a, on which the excitation light E is incident, a fourth surface 53b, which differs from the third surface 53a, and a second side surface 53c, which intersects the third surface 53a and the fourth surface 53b. Assuming that the first light transmissive member 53 has a rectangular shape when viewed along a normal to the third surface 53b, the combination of all the four surfaces that intersect the third surface 53a and the fourth surface 53b is called the second side surface 53c. The first light transmissive member 53 transmits at least the excitation light E. In particular, the first light transmissive member 53 desirably absorbs a small amount of visible light and contains a small number of scattering elements. The refractive index of the first light transmissive member 53 is greater than the refractive index of the wavelength conversion layer 52.

The first light transmissive member 53 is not necessarily made of a specific material and is desirably made of a material having a large refractive index and high thermal conductivity, for example, a material containing silicon carbide (SiC), such as single-crystal silicon carbide. The first light transmissive member 53 can instead be made, for example, of single-crystal sapphire or a single-crystal aluminum nitride. The first light transmissive member 53 may still instead be made of a light diffusive material, such as ground glass. The first light transmissive member 53 has, for example, a thickness of 250 μm.

The first dichroic mirror 54 is provided between the first surface 52a of the wavelength conversion layer 52 and the fourth surface 53b of the first light transmissive member 53, which are surfaces facing each other. The first dichroic mirror 54 has a wavelength separation characteristic that causes the first dichroic mirror 54 to transmit light that belongs to the first wavelength band and reflect light that belongs to the second wavelength band. That is, the first dichroic mirror 54 transmits the excitation light E and reflects the florescence Y. The first dichroic mirror 54 is formed of a dielectric multilayer film. The dielectric multilayer film is formed, for example, of an $SiO_2$ film and a $TiO_2$ film alternately layered on each other multiple times. That is, the dielectric multilayer film has a configuration in which two types of dielectric films having refractive indices different from each other are alternately layered on each other multiple times. The number of dielectric films that form the dielectric multilayer film are not limited to a specific number, and the thicknesses of the dielectric films are not limited to specific values.

In the steps of manufacturing the wavelength conversion section 56, the first dichroic mirror 54 is formed, for example, by depositing the dielectric multilayer film on the fourth surface 53b of the first light transmissive member 53. The method described above allows deposition of a smoother dielectric multilayer film on the fourth surface 53b of the first light transmissive member 53 than deposition of the dielectric multilayer film on the wavelength conversion layer 52, whereby the characteristics of the first dichroic mirror 54 can be improved. The first light transmissive member 53 having the first dichroic mirror 54 formed on the fourth surface 53b is bonded to the wavelength conversion layer 52 via a light transmissive adhesive layer (not shown). The adhesive layer may be made of a resin-based adhesive, or the two components may be bonded to each other in a GlassLike/GlueLess (GL) bonding process.

The reflection layer 55 is provided on the side surface of the recess 51f of the first heat dissipation member 51. That is, the reflection layer 55 is so provided as to face the first side surface 52c of the wavelength conversion layer 52 and the second side surface 53c of the first light transmissive member 53. The reflection layer 55 reflects at least the florescence Y. The reflection layer 55 may also reflect the excitation light E. The reflection layer 55 may be made of a metal material having high optical reflectance, such as aluminum and silver, or may be formed of a dielectric multilayer film so characterized as to reflect at least light that belongs to the second wavelength band.

The wavelength conversion section 56 and the reflection layer 55 are desirably so disposed as to separate from each other. That is, an air layer 57 is desirably interposed between the first side surface 52c of the wavelength conversion layer 52 and the reflection layer 55 and between the second side surfaces 53c of the first light transmissive member 53 and the reflection layer 55.

The wavelength converter 23 having the configuration described above is so configured as shown in FIG. 2 that the first surface 51a of the first heat dissipation member 51 faces the light collection system 22 and the second surface 52*b* of the wavelength conversion layer 52 faces the pickup system 27. The excitation light E having exited out of the light collection system 22 is therefore incident on the third surface 53*a* of the first light transmissive member 53 through the opening 51*k* of the first heat dissipation member 51, and the florescence Y having exited via the second surface 52*b* of the wavelength conversion layer 52 enters the pickup system 27. That is, the wavelength converter 23 according to the present embodiment is a transmissive wavelength converter.

Actions and effects of the wavelength converter 23 according to the present embodiment will be described below.

In the wavelength converter 23, the excitation light E having entered the first light transmissive member 53 passes through the first dichroic mirror 54 and enters the wavelength conversion layer 52. The excitation light E is converted by the wavelength conversion layer 52 in terms of wavelength into the florescence Y, and the florescence Y isotropically travels omnidirectionally in the wavelength conversion layer 52. Therefore, a portion of the florescence Y reaches the second surface 52*b* of the wavelength conversion layer 52, another portion of the florescence Y reaches the first surface 52*a* of the wavelength conversion layer 52, and still another portion of the florescence Y reaches the first side surface 52*c* of the wavelength conversion layer 52.

Out of the florescence Y having reached the second surface 52*b*, the florescence Y incident on the second surface 52*b* at angles of incidence smaller than the critical angle passes through the second surface 52*b* and exits out of the wavelength converter 23. In contrast, the florescence Y incident on the second surface at angles of incidence greater than or equal to the critical angle is reflected off the second surface 52*b*, then travels through the interior of the wavelength conversion layer 52, and reaches the first surface 52*a* or the first side surface 52*c*.

The florescence Y having reached the first surface 52*a* is reflected off the first dichroic mirror 54 and travels toward the second surface 52*b* again. However, the spectral characteristics of the first dichroic mirror 54 depends on the angle of incidence of light incident thereon. Therefore, out of the florescence Y incident on the first dichroic mirror 54, the florescence Y incident on the first dichroic mirror 54 at angles of incidence smaller than a predetermined angle passes through the first dichroic mirror 54 and enters the first light transmissive member 53. Since the refractive index of the wavelength conversion layer 52 differs from the refractive index of the first light transmissive member 53, the florescence Y emitted from the wavelength conversion layer 52 is refracted when it enters the first light transmissive member 53.

For example, assuming that the wavelength conversion layer 52 is made of YAG:Ce and the first light transmissive member 53 is made of SiC, a specific refractive index of the wavelength conversion layer 52 is about 1.82, and a specific refractive index of the first light transmissive member 53 is about 2.6. Now, let $\alpha 1$ be the angle of incidence of the florescence Y incident on the first surface 52*a* of the wavelength conversion layer 52 and $\alpha 2$ be the angle of emergence of the florescence Y to be incident on the fourth surface 53*b* of the first light transmissive member 53, as shown in FIG. 3, and $\alpha 1=33°$ and $\alpha 2=22.4°$ are derived from Snell's law. That is, since the refractive index of the first light transmissive member 53 is greater than the refractive index of the wavelength conversion layer 52, the angle of emergence $\alpha 2$ of the florescence Y that exits out of the wavelength conversion layer 52 and enters the first light transmissive member 53 is smaller than the angle of incidence $\alpha 1$.

The florescence Y having entered the first light transmissive member 53, when it reaches the third surface 53*a*, is totally reflected off the third surface 53*b*, and travels toward the wavelength conversion layer 52 again. The florescence Y then passes through the first dichroic mirror 54, enters the wavelength conversion layer 52, and travels toward the second surface 52*b*. The optical path of the florescence Y having reached the second surface 52*b* has been described above.

Out of the florescence Y having reached the first side surface 52*c*, the florescence Y incident on the first side surface 52*c* at angles of incidence greater than or equal to the critical angle is totally reflected off the first side surface 52*c*, then travels through the interior of the wavelength conversion layer 52, and reaches the first surface 52*a* or the second surface 52*b*. The florescence Y incident on the first side surface 52*c* at angles of incidence smaller than the critical angle passes through the first side surface 52*c* and exits out of the wavelength conversion layer 52. Since the reflection layer 55 is so provided as to face the first side surface 52*c*, the florescence Y emitted from the wavelength conversion layer 52 is reflected off the reflection layer 55 and enters the wavelength conversion layer 52 again.

Part of the florescence Y having entered the first light transmissive member 53 reaches the second side surface 53*c*. Out of the florescence Y described above, the florescence Y incident on the second side surface 53*c* at angles of incidence greater than or equal to the critical angle is reflected off the second side surface 53*c*, then travels through the interior of the first light transmissive member 53, as in the case of the florescence Y having reached the first side surface 52*c* of the wavelength conversion layer 52. The florescence Y incident on the second side surface 53*c* at angles of incidence smaller than the critical angle exits out of the first light transmissive member 53, is then reflected off the reflection layer 55, and enters the first light transmissive member 53 again.

As described above, in the wavelength converter 23 according to the present embodiment, the first dichroic mirror 54, which is provided between the first light transmissive member 53 and the wavelength conversion layer 52 and reflects the fluorescence Y, prevents the fluorescence Y from traveling in the direction opposite the traveling direction of the excitation light E, that is, toward the side on which the excitation light E is incident. A decrease in the efficiency at which the fluorescence Y is used can thus be suppressed.

In the wavelength converter 23 according to the present embodiment, the reflection layer 55, which is so provided as to face the first side surface 52*c* of the wavelength conversion layer 52 and the second side surface 53*c* of the first light transmissive member 53 and reflects the fluorescence Y, reflects the florescence Y having exited via the first side surface 52*c* and the second side surface 53*c* and allows the fluorescence Y to enter the wavelength conversion layer 52 and the first light transmissive member again. A decrease in the efficiency at which the fluorescence Y is used can thus be suppressed. Further, when the reflection layer 55 reflects the excitation light E in addition to the fluorescence Y, a decrease in the efficiency at which the excitation light E is used can also be suppressed.

When the reflection layer 55 is made of a metal material, and the wavelength conversion layer 52 is in contact with the reflection layer 55 and the first light transmissive member 53 is in contact with the reflection layer 55, part of the fluorescence Y is absorbed by the reflection layer 55 whenever the fluorescence Y reaches the first side surface 52c or the second side surface 53c and reflected off the reflection layer 55, resulting in loss of the fluorescence Y. In contrast, in the wavelength converter 23 according to the present embodiment, the fluorescence Y totally reflected off the first side surface 52c or the second side surface 53c is not incident on the reflection layer 55 because the air layer 57 is interposed between the wavelength conversion layer 52 and the reflection layer 55 and between the first light transmissive member 53 and the reflection layer 55. Loss of the fluorescence Y that occurs at the reflection layer 55 can thus be reduced even when the reflection layer is made of a metal material.

Further, in the wavelength converter 23 according to the present embodiment, when the first light transmissive member 53, which is made of SiC having high thermal conductivity, heat generated in the wavelength conversion layer 52 when it is irradiated with the excitation light E can be transferred to the first light transmissive member 53 and dissipated via the first heat dissipation member 51. An increase in temperature of the wavelength conversion layer 52 can thus be suppressed, whereby the conversion efficiency of the wavelength conversion layer 52 can be maintained.

In the first light source apparatus 11 according to the present embodiment, in which the first dichroic mirror 54, which reflects the fluorescence Y, is provided between the first light transmissive member 53 and the wavelength conversion layer 52, the amount of fluorescence Y that enters the first light transmissive member 53 can be reduced as compared with a case where the first dichroic mirror 54 is not provided. The configuration described above can reduce the amount of fluorescence Y that enters the first light transmissive member 53 and then travels in a direction that intersects the direction in which the fluorescence Y enters the first light transmissive member 53, resulting in suppression of an increase in the ratio of the area via which the fluorescence Y exits to the area on which the excitation light E is incident or what is called bleeding of the fluorescence Y.

Figure 4:
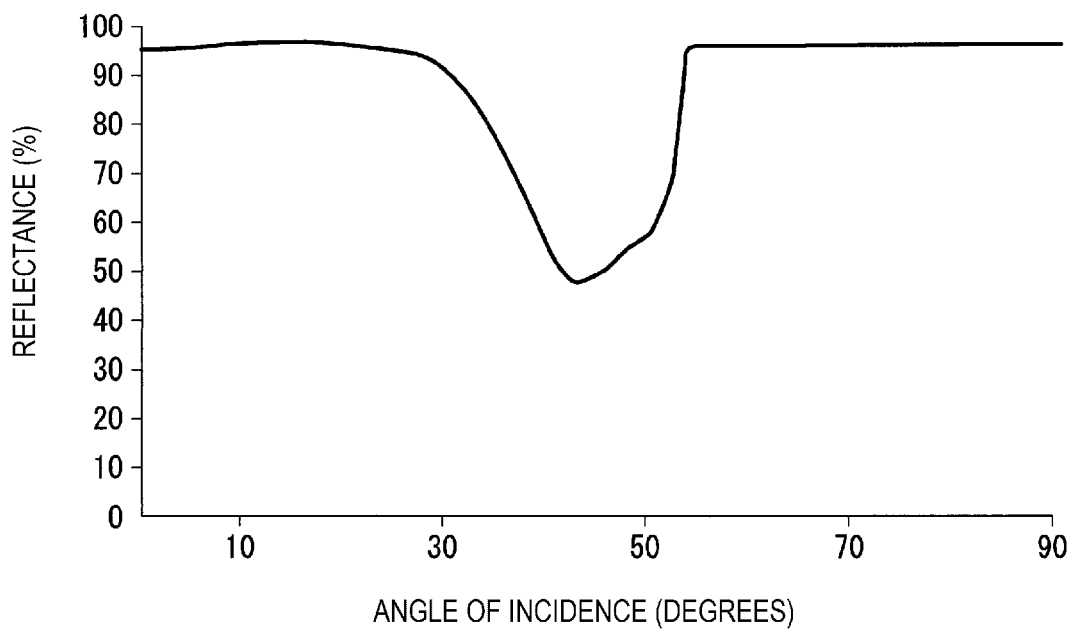
FIG. 4 shows an example of the characteristics of a dielectric multilayer film.

FIG. 4 shows an example of the reflectance characteristic of the dielectric multilayer film that forms the first dichroic mirror 54. In FIG. 4, the horizontal axis represents the angle of incidence of the light (degrees), and the vertical axis represents the reflectance (%).

When the first dichroic mirror 54 is formed of the dielectric multilayer film, the reflectance of the dielectric multilayer film has a substantially fixed value greater than or equal to 95% in the areas where the angle of incidence ranges from 0 to 30° and from 55 to 90° and thereabouts and has a minimum value in the vicinity of the angle of incidence of about 40°, which is about 50% of the fixed value, as shown in FIG. 4. Therefore, even when the fluorescence Y is incident from the wavelength conversion layer 52 on the first dichroic mirror 54 in a direction substantially perpendicular thereto, that is, at an angle of incidence close to 0°, most of the fluorescence Y is reflected off the first dichroic mirror 54 and hardly enters the first light transmissive member 53.

On the other hand, the present inventor has found based on the light orientation distribution of fluorescence emitted from a phosphor that the amount of fluorescence Y incident on the first dichroic mirror 54 is maximized at an angle of incidence of about 40°. According to the reflectance characteristic shown in FIG. 4, about half of the fluorescence Y incident at the angle of incidence of 40° passes through the first dichroic mirror 54 and enters the first light transmissive member 53. When the angle of incidence $\alpha1$ of the fluorescence Y that enters the first light transmissive member 53 via the first dichroic mirror 54 is 40°, as shown in FIG. 3, and the refractive index of the wavelength conversion layer 52 is 1.82 and the refractive index of the first light transmissive member 53 is 2.6, the angle of emergence $\alpha2$ is 26.4°. In this case, when the fluorescence Y directly reaches the first surface 53a of the first light transmissive member 53, the angle of incidence of the fluorescence Y with respect to the first surface 53a is 26.4°.

Assuming that the refractive index of typical optical glass is 1.5, the critical angle at the interface between the optical glass and the air is about 42°. Therefore, if the first light transmissive member 53 is made of typical optical glass, the fluorescence Y having entered the first light transmissive member 53 at the angle of incidence of 26.4° is not totally reflected off the first surface 53a of the first light transmissive member 53 but exits into the air, probably resulting in loss of the fluorescence Y.

In contrast, in the present embodiment, in which the first light transmissive member 53 is made of SiC, the refractive index of which is about 2.6, the critical angle is 22.6°, which is smaller than the aforementioned critical angle when the first light transmissive member 53 is made of the optical glass. As a result, the fluorescence Y having entered the first light transmissive member 53 at the angle of incidence of 26.4° is totally reflected off the first surface 53a of the first light transmissive member 53 and does not exit into the air. The configuration in the present embodiment, in which the first light transmissive member 53 is made of SiC, therefore allows reduction in the amount of fluorescence Y that travels toward the side surface 53c with loss of the fluorescence Y suppressed, whereby the bleeding of the fluorescence Y can be suppressed.

As described above, a first light source apparatus 11 having a small etendue and allowing downstream optical systems to use light at high efficiency can be achieved.

The projector 1 according to the present embodiment, which includes the first light source apparatus 11 described above, excels in the light use efficiency.

Second Embodiment

A second embodiment of the present disclosure will be described below with reference to FIG. 5.

The configurations of a projector and a light source apparatus according to the second embodiment are the same as those in the first embodiment, and the configuration of the wavelength converter differs from that in the first embodiment. No description of the projector or the light source apparatus will therefore be made.

Figure 5:
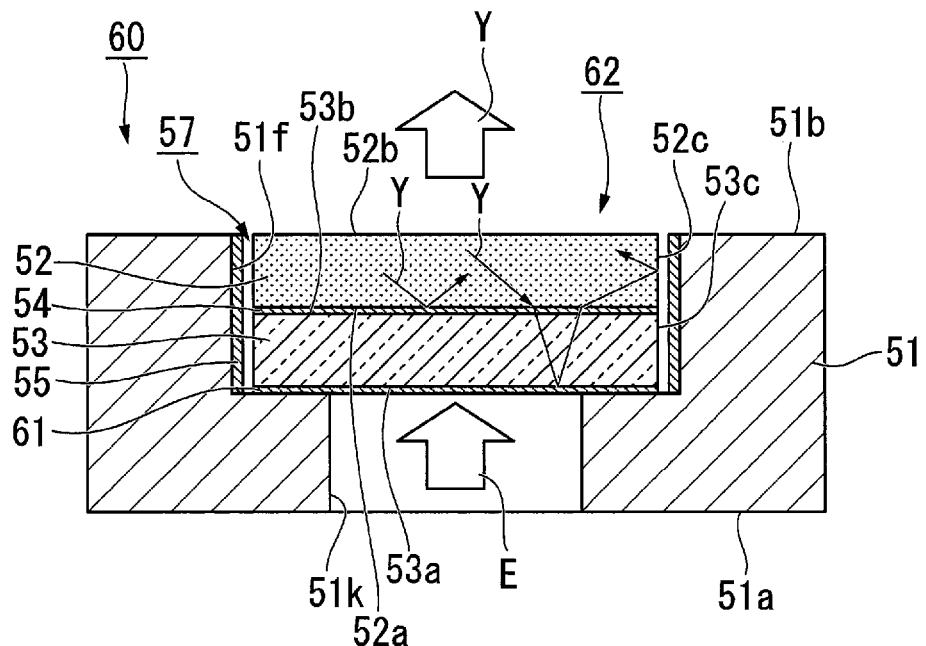
FIG. 5 is a cross-sectional view of a wavelength converter according to a second embodiment.

FIG. 5 is a cross-sectional view of a wavelength converter 60 according to the second embodiment.

In FIG. 5, components common to those in the figures used in the description of the first embodiment have the same reference characters and will not be described.

The wavelength converter 60 includes the first heat dissipation member 51, the wavelength conversion layer 52, the first light transmissive member 53, the first dichroic mirror 54 (first layer), a second dichroic mirror 61 (second layer), and the reflection layer 55, as shown in FIG. 5. The second dichroic mirror 61, the first light transmissive member 53, the first dichroic mirror 54, and the wavelength conversion layer 52 are stacked on each other in the presented order from the side on which the excitation light E is incident to form a wavelength conversion section 62.

The second dichroic mirror 61 is so provided as to face the third surface 53a of the first light transmissive member 53. The second dichroic mirror 61 has a wavelength separation characteristic that causes the second dichroic mirror 61 to transmit light that belongs to the first wavelength band and reflect light that belongs to the second wavelength band. That is, the second dichroic mirror 61 transmits the excitation light E and reflects the florescence Y. The second dichroic mirror 61 is formed of a dielectric multilayer film. The dielectric multilayer film is formed, for example, of an $SiO_2$ film and a $TiO_2$ film alternately layered on each other multiple times. That is, the dielectric multilayer film has a configuration in which two types of dielectric films having refractive indices different from each other are alternately layered on each other multiple times. The number of dielectric films that form the dielectric multilayer film are not limited to a specific number, and the thicknesses of the dielectric films are not limited to specific values.

The other configurations of the wavelength converter 60 are the same as those of the wavelength converter 23 according to the first embodiment.

The wavelength converter 60 according to the present embodiment can also provide the same effects as those provided by the wavelength converter 23 according to the first embodiment, such as suppression of a decrease in the efficiency at which the fluorescence Y is used, reduction in loss of the fluorescence Y that occurs at the reflection layer 55 and suppression of the bleeding of the fluorescence Y, and maintenance of the conversion efficiency of the wavelength conversion layer 52.

Further, the wavelength converter 60 according to the present embodiment, in which the second dichroic mirror 61 is so provided as to face the third surface 53a of the first light transmissive member 53, allows the fluorescence Y having passed through the first dichroic mirror 54, having entered the first light transmissive member 53, and then having reached the third surface 53a to be reflected off the second dichroic mirror 61 and enter the wavelength conversion layer 52 again. A decrease in the efficiency at which the fluorescence Y is used can thus be suppressed.

The present embodiment can also provide the same effects as those provided in the first embodiment, such as the first light source apparatus 11 and the projector 1 having high light use efficiency.

Third Embodiment

A third embodiment of the present disclosure will be described below with reference to FIG. 6.

The configurations of a projector and a light source apparatus according to the third embodiment are the same as those in the first embodiment, and the configuration of the wavelength converter differs from that in the first embodiment. No description of the projector or the light source apparatus will therefore be made.

Figure 6:
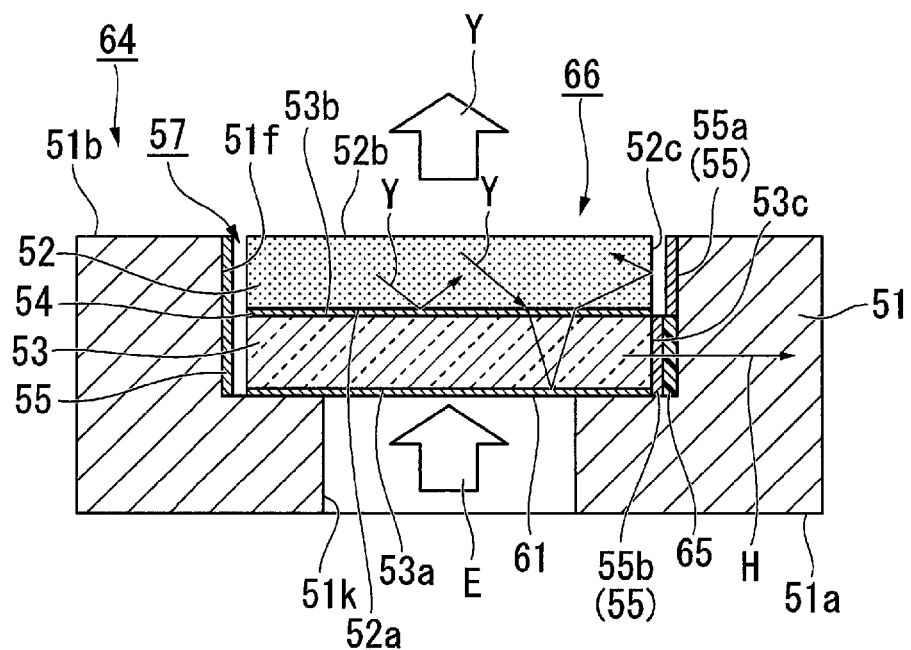
FIG. 6 is a cross-sectional view of a wavelength converter according to a third embodiment.

FIG. 6 is a cross-sectional view of a wavelength converter 64 according to the third embodiment.

In FIG. 6, components common to those in the figures used in the description of the aforementioned embodiments have the same reference characters and will not be described.

The wavelength converter 64 includes the first heat dissipation member 51, the wavelength conversion layer 52, the first light transmissive member 53, the first dichroic mirror 54 (first layer), the second dichroic mirror 61 (second layer), a second heat dissipation member 65, and the reflection layer 55, as shown in FIG. 6. The second dichroic mirror 61, the first light transmissive member 53, the first dichroic mirror 54, and the wavelength conversion layer 52 are stacked on each other in the presented order from the side on which the excitation light E is incident to form a wavelength conversion section 66.

A reflection layer 55b is provided on the second side surface 53c of the first light transmissive member 53. A reflection layer 55a is also provided on the side surface of the recess 51f of the first heat dissipation member 51. The reflection layer 55a provided on the side surface of the recess 51f and the reflection layer 55b provided on the second side surface 53c of the first light transmissive member 53 may be formed of reflection layers of the same type or reflection layers of different types. In the example shown in FIG. 6, the reflection layer 55a provided on the side surface of the recess 51f and the reflection layer 55b provided on the second side surface 53c of the first light transmissive member 53 are so provided as to be separate from each other and may instead be so provided as to be continuous with each other. The reflection layer 55 may be made of a metal material having high optical reflectance, such as aluminum and silver, or may be formed of dielectric multilayer films that reflect at least light that belongs to the second wavelength band, as in the first embodiment.

The second heat dissipation member 65 is provided between the reflection layer 55b and the first heat dissipation member 51. The second heat dissipation member 65 is in contact both with the reflection layer 55b and the first heat dissipation member 51. That is, the reflection layer 55a is provided between the first heat dissipation member 51 and the first side surface 52c of the wavelength conversion layer 52, the second heat dissipation member 65 is provided between the first heat dissipation member 51 and the second side surface 53c of the first light transmissive member 53, and the reflection layer 55b is provided between the first heat dissipation member 51 and the second side surface 53c of the first light transmissive member 53. The second heat dissipation member 65 is provided between the reflection layer 55b and the first heat dissipation member 51. The second heat dissipation member 65 forms part of a heat transfer path along which heat H generated in the wavelength conversion layer 52 when it is irradiated with the excitation light E is transferred via the first dichroic mirror 54, the first light transmissive member 53, the reflection layer 55b, the second heat dissipation member 65, and the first heat dissipation member 51. The second heat dissipation member 65 is made of a bonding material that bonds the reflection layer 55b to the first heat dissipation member 51. The bonding material is desirably a material having high thermal conductivity, for example, silver paste using silver nano-particles, gold paste using gold nano-particles, or a gold-tin solder.

In the present embodiment, the reflection layer 55b and the second heat dissipation member 65 are provided on one of the second side surfaces that form the second side surface 53c of the first light transmissive member 53 and may be further provided on another of the second side surfaces.

The other configurations of the wavelength converter 64 are the same as those of the wavelength converter 60 according to the second embodiment.

The wavelength converter 64 according to the present embodiment can also provide the same effects as those provided by the wavelength converter 23 according to the first embodiment, such as suppression of a decrease in the efficiency at which the fluorescence Y is used, reduction in loss of the fluorescence Y that occurs at the reflection layer 55 and suppression of the bleeding of the fluorescence Y, and maintenance of the conversion efficiency of the wavelength conversion layer 52.

Further, the wavelength converter 64 according to the present embodiment, which includes the second heat dissipation member 65, which bonds the reflection layer 55b to the first heat dissipation member 51, allows the heat H transferred from the wavelength conversion layer 52 to the first light transmissive member 53 to dissipate through the second side surface 53c to the first heat dissipation member 51 via the second heat dissipation member 65. An increase in temperature of the wavelength conversion layer 52 can thus be efficiently suppressed, whereby the conversion efficiency of the wavelength conversion layer 52 can be further increased.

In the wavelength converter 64 according to the present embodiment, the reflection layer 55b and the second heat dissipation member 65 are provided in the presented order in the direction from the second side surface 53c of the first light transmissive member 53 toward the side surface of the recess 51f of the first heat dissipation member 51. In place of the configuration described above, the second heat dissipation member 65 and the reflection layer 55b may be provided in the presented order in the direction from the second side surface 53c of the first light transmissive member 53 toward the side surface of the recess 51f of the first heat dissipation member 51. In the latter case, the second heat dissipation member 65 needs to transmit light.

Fourth Embodiment

A fourth embodiment of the present disclosure will be described below with reference to FIG. 7.

The configurations of a projector and a light source apparatus according to the fourth embodiment are the same as those in the first embodiment, and the configuration of the wavelength converter differs from that in the first embodiment. No description of the projector or the light source apparatus will therefore be made.

Figure 7:
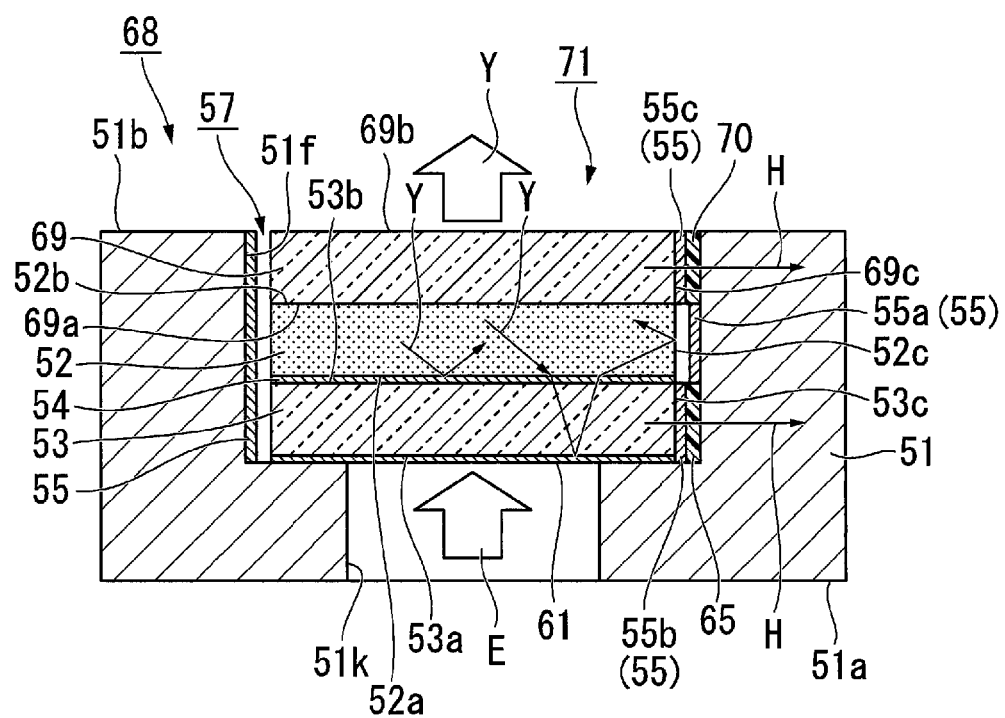
FIG. 7 is a cross-sectional view of a wavelength converter according to a fourth embodiment.

FIG. 7 is a cross-sectional view of a wavelength converter 68 according to the fourth embodiment.

In FIG. 7, components common to those in the figures used in the description of the aforementioned embodiments have the same reference characters and will not be described.

The wavelength converter 68 includes the first heat dissipation member 51, the wavelength conversion layer 52, the first light transmissive member 53, a second light transmissive member 69, the first dichroic mirror 54 (first layer), the second dichroic mirror 61 (second layer), the second heat dissipation member 65, a third heat dissipation member 70, and the reflection layer 55, as shown in FIG. 7. The second dichroic mirror 61, the first light transmissive member 53, the first dichroic mirror 54, the wavelength conversion layer 52, and the second light transmissive member 69 are stacked on each other in the presented order from the side on which the excitation light E is incident to form a wavelength conversion section 71.

The second light transmissive member 69 is so provided as to face the second surface 52b of the wavelength conversion layer 52. The second light transmissive member 69 has a fifth surface 69a, which faces the second surface 52b of the wavelength conversion layer 52, a sixth surface 69b, which differs from the fifth surface 69a, and a third side surface 69c, which intersects the fifth surface 69a and the sixth surface 69b. Assuming that the second light transmissive member 69 has a rectangular shape when viewed along the direction of a normal to the sixth surface 69b, the combination of all the four surfaces that intersect the fifth surface 69a and the sixth surface 69b is called the third side surface 69c. The second light transmissive member 69 transmits at least the fluorescence Y. In particular, the second light transmissive member 69 desirably absorbs a small amount of visible light and contains a small number of scattering elements. The refractive index of the second light transmissive member 69 is greater than the refractive index of the wavelength conversion layer 52.

The second light transmissive member 69 is not necessarily made of a specific material and is desirably made of a material having a large refractive index and high thermal conductivity, for example, a material containing silicon carbide (SiC), such as single-crystal silicon carbide, as in the case of the first light transmissive member 53. The second light transmissive member 69 can instead be made, for example, of single-crystal sapphire or a single-crystal aluminum nitride. The second light transmissive member 69 may still instead be made of a light diffusive material, such as ground glass. The second light transmissive member 69 has, for example, a thickness of 250 μm. The material and thickness of the second light transmissive member 69 may be equal to or differ from the material and thickness of the first light transmissive member 53.

A reflection layer 55c is provided on the third side surface 69c of the second light transmissive member 69. The reflection layer 55a is also provided on the side surface of the recess 51f of the first heat dissipation member 51. The reflection layer 55a provided on the side surface of the recess 51f, the reflection layer 55b provided on the second side surface 53c of the first light transmissive member 53, and the reflection layer 55c provided on the third side surface 69c of the second light transmissive member 69 may be formed of reflection layers of the same type or reflection layers of different types.

In the example shown in FIG. 7, the reflection layer 55a provided on the side surface of the recess 51f, the reflection layer 55b provided on the second side surface 53c of the first light transmissive member 53, and the reflection layer 55c provided on the third side surface 69c of the second light transmissive member 69 are so provided as to be separate from each other, and at least two of the reflection layers may instead be so provided as to be continuous with each other. The reflection layer 55 may be made of a metal material having high optical reflectance, such as aluminum and silver, or may be formed of dielectric multilayer films that reflect at least light that belongs to the second wavelength band.

The third heat dissipation member 70 is provided between the reflection layer 55c provided on the third side surface 69c of the second light transmissive member 69 and the first heat dissipation member 51. The third heat dissipation member 70 is in contact both with the reflection layer 55c and the first heat dissipation member 51. That is, the second surface 52b of the wavelength conversion layer 52 and the fifth surface 69a of the second light transmissive member 69 are so provided as to face each other, the third heat dissipation member 70 is provided between the first heat dissipation member 51 and the third side surface 69c of the second light transmissive member 69, and the reflection layer 55c is provided between the first heat dissipation member 51 and the third side surface 69c of the second light transmissive member 69. The third heat dissipation member 70 is provided between the reflection layer 55c and the first heat dissipation member 51. The third heat dissipation member 70 forms part of a heat transfer path along which the heat H generated in the wavelength conversion layer 52 when it is irradiated with the excitation light E is transferred via the second light transmissive member 69, the reflection layer 55c, the third heat dissipation member 70, and the first heat dissipation member 51. The third heat dissipation member 70 is made of a bonding material that bonds the reflection layer 55c to the first heat dissipation member 51. The bonding material is desirably a material having high thermal conductivity, for example, silver paste using silver nano-particles, gold paste using gold nano-particles, or a gold-tin solder.

In the present embodiment, the reflection layer 55c and the third heat dissipation member 70 are provided on one of the third side surfaces that form the third side surface 69c of the second light transmissive member 69 and may be further provided on another of the third side surfaces.

The other configurations of the wavelength converter 68 are the same as those of the wavelength converter 64 according to the third embodiment.

The wavelength converter 68 according to the present embodiment can also provide the same effects as those provided by the wavelength converter 23 according to the first embodiment, such as suppression of a decrease in the efficiency at which the fluorescence Y is used, reduction in loss of the fluorescence Y that occurs at the reflection layer 55 and suppression of the bleeding of the fluorescence Y, and maintenance of the conversion efficiency of the wavelength conversion layer 52.

Further, the wavelength converter 68 according to the present embodiment, in which the second light transmissive member 69 is so provided as to face the second surface 52b of the wavelength conversion layer 52 in addition to the configuration in the third embodiment, allows the heat H generated in the wavelength conversion layer 52 to be transferred both to the first light transmissive member 53 and the second light transmissive member 69. Further, since the third heat dissipation member 70, which bonds the reflection layer 55c to the first heat dissipation member 51, is provided, the heat transferred from the wavelength conversion layer 52 to the second light transmissive member 69 can be dissipated through the third side surface 69c to the first heat dissipation member 51 via the third heat dissipation member 70. An increase in temperature of the wavelength conversion layer 52 can thus be efficiently suppressed, whereby the conversion efficiency of the wavelength conversion layer 52 can be further increased.

In the wavelength converter 68 according to the present embodiment, the reflection layer 55c and the third heat dissipation member 70 are provided in the presented order in the direction from the third side surface 69c of the second light transmissive member 69 toward the side surface of the recess 51f of the first heat dissipation member 51. In place of the configuration described above, the third heat dissipation member 70 and the reflection layer 55c may be provided in the presented order in the direction from the third side surface 69c of the second light transmissive member 69 toward the side surface of the recess 51f of the first heat dissipation member 51. In the latter case, the third heat dissipation member 70 needs to transmit light.

Fifth Embodiment

A fifth embodiment of the present disclosure will be described below with reference to FIGS. 8 and 9.

The configuration of a projector according to the fifth embodiment is the same as that in the first embodiment, and the configurations of the illumination apparatus and the wavelength converter differ from those in the first embodiment. No description of the projector will therefore be made.

Figure 8:
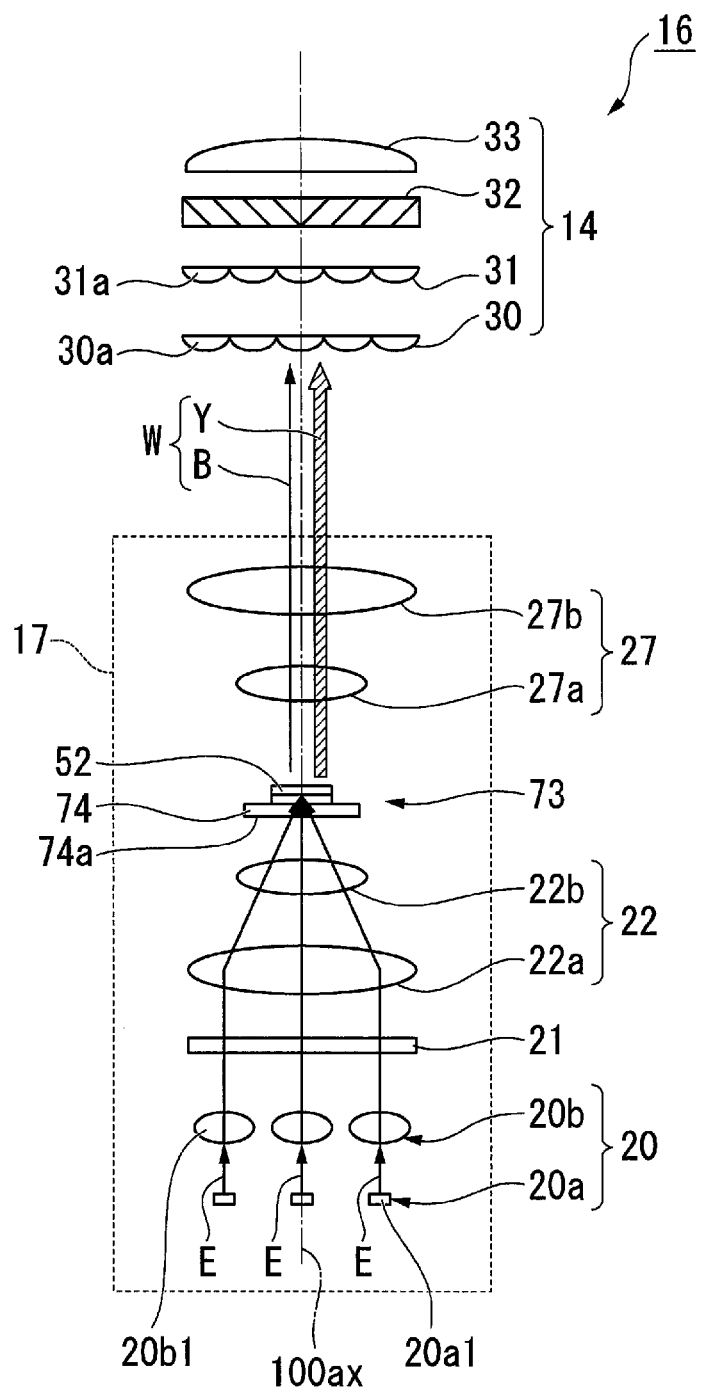
FIG. 8 is a schematic configuration diagram of an illumination apparatus according to a fifth embodiment.

FIG. 8 is a schematic configuration diagram of an illumination apparatus 16 according to the fifth embodiment.

In FIG. 8, components common to those in FIG. 2 used in the description of the first embodiment have the same reference characters and will not be described.

The illumination apparatus 16 according to the present embodiment includes a first light source apparatus 17 and the homogenizing illuminator 14, as shown in FIG. 8. That is, the illumination apparatus 16 according to the present embodiment does not include the second light source apparatus 12 or the dichroic mirror 13 in the illumination apparatus 2 according to the first embodiment. The first light source apparatus 17 according to the present embodiment outputs the white light W containing the blue light B and the yellow fluorescence Y. The first light source apparatus 17 includes the first light source 20, the diffuser 21, the light collection system 22, a wavelength converter 73, and the pickup system 27.

Figure 9:
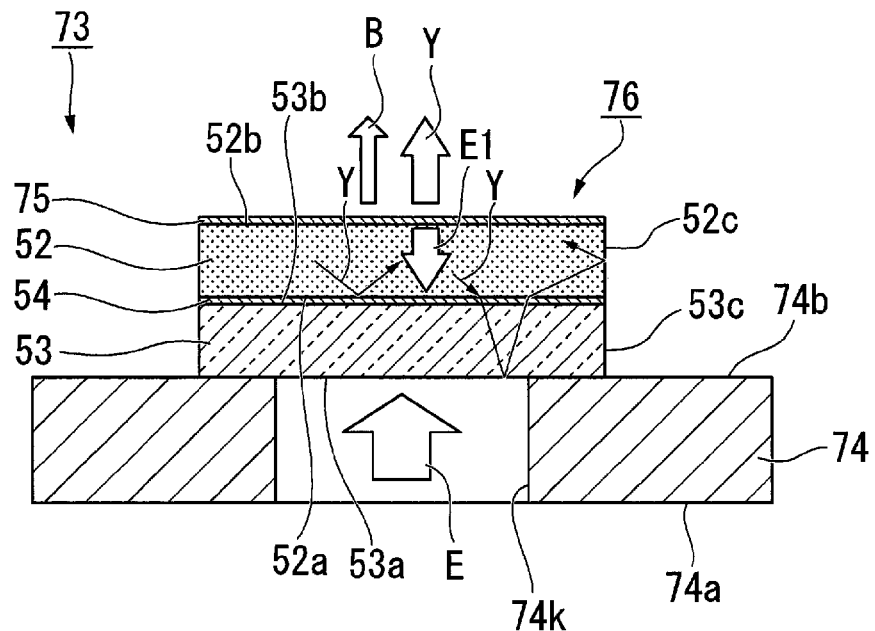
FIG. 9 is a cross-sectional view of a wavelength converter.

FIG. 9 is a cross-sectional view of the wavelength converter 73 according to the fifth embodiment.

In FIG. 9, components common to those in the figures used in the description of the aforementioned embodiments have the same reference characters and will not be described.

The wavelength converter 73 includes a first heat dissipation member 74, the wavelength conversion layer 52, the first light transmissive member 53, the first dichroic mirror 54 (first layer), and a third dichroic mirror 75, as shown in FIG. 9. The first light transmissive member 53, the first dichroic mirror 54, the wavelength conversion layer 52, and the third dichroic mirror 75 are stacked on each other in the presented order from the side on which the excitation light E is incident to form a wavelength conversion section 76.

The first heat dissipation member 74 is formed of a planar plate and has a first surface 74a, which is provided with an opening 74k, which transmits the excitation light E, and a second surface 74b, which differs from the first surface 74a.

The third dichroic mirror 75 is so provided as to face the second surface 52b of the wavelength conversion layer 52. The third dichroic mirror 75 has a wavelength separation characteristic that causes the third dichroic mirror 75 to reflect part of light that belongs to the first wavelength band, transmit other part of light that belongs to the first wavelength band, and transmit light that belongs to the second wavelength band. That is, the third dichroic mirror 75 reflects a portion E1 of the excitation light E and transmits the other portion of the excitation light E as the blue light B and the florescence Y. The third dichroic mirror 75 is formed of a dielectric multilayer film. The dielectric multilayer film is formed, for example, of an $SiO_2$ film and a $TiO_2$ film alternately layered on each other multiple times. That is, the dielectric multilayer film has a configuration in which two types of dielectric films having refractive indices different from each other are alternately layered on each other multiple times. The number of dielectric films that form the dielectric multilayer film are not limited to a specific number, and the thicknesses of the dielectric films are not limited to specific values.

In the present embodiment, the wavelength conversion section 76 is bonded to the second surface 74b of the first heat dissipation member 74, and no recess that accommodates the wavelength conversion section 76 is provided in the second surface 74b, unlike the first embodiment. Further, no reflection layer that faces the first side surface 52c of the wavelength conversion layer or the second side surface 53c of the first light transmissive member 53 is provided. However, also in the wavelength converter 73 according to the present embodiment, the recess and the reflection layer may be provided as in the wavelength converter 23 according to the first embodiment.

The other configurations of the wavelength converter 73 are the same as those of the wavelength converter 23 according to the first embodiment.

The wavelength converter 73 according to the present embodiment can also provide the same effects as those provided by the wavelength converter 23 according to the first embodiment, such as suppression of a decrease in the efficiency at which the fluorescence Y is used.

In the wavelength converter 73 according to the present embodiment, since the third dichroic mirror 75, which reflects the portion E1 of the excitation light E and transmits the fluorescence Y, is provided on the second surface 52b of the wavelength conversion layer 52, the excitation light E that has entered the wavelength conversion layer 52, but has not been absorbed by the phosphor, and has reached the second surface 52b is reflected off the third dichroic mirror 75 and travels through the interior of the wavelength conversion layer 52 toward the first surface 52a. Since the excitation light E is converted in terms of wavelength into the fluorescence Y when the excitation light E travels through the interior of the wavelength conversion layer 52 back and forth, as described above, the thickness of the wavelength conversion layer 52 can be reduced as compared with a case where the third dichroic mirror 75 is not provided. An increase in the temperature of the wavelength conversion layer 52 can thus be suppressed, whereby a decrease in the conversion efficiency of the wavelength conversion layer 52 can be suppressed.

Further, in the wavelength converter 73 according to the present embodiment, the blue light B, which is the other part of the excitation light E, and the fluorescence Y pass through the third dichroic mirror 75, whereby only the wavelength converter 73 can produce the white light W. Therefore, the illumination apparatus 16 according to the present embodiment, which includes the wavelength converter 73 described above, does not require the second light source apparatus 12 or the dichroic mirror 13 in the first embodiment, whereby the apparatus configurations of the illumination apparatus 16 and the projector 1 can be simplified.

Moreover, the wavelength converter 73 according to the present embodiment allows adjustment of the white balance of the white light W by changing the thickness of the wavelength conversion layer 52.

In the illumination apparatus 16 according to the present embodiment, wavelength converters according to variations described below can be used.

First Variation

A first variation will be described below with reference to FIG. 10.

Figure 10:
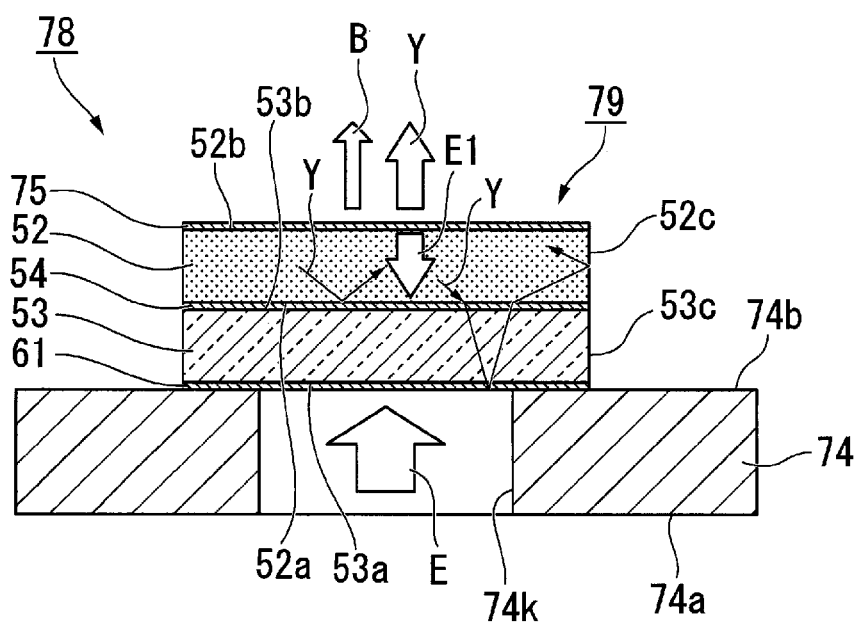
FIG. 10 is a cross-sectional view of a wavelength converter according to a first variation.

FIG. 10 is a cross-sectional view of a wavelength converter 78 according to the first variation.

In FIG. 10, components common to those in the figures used in the description of the aforementioned embodiments have the same reference characters and will not be described.

The wavelength converter 78 according to the present variation includes the first heat dissipation member 74, the wavelength conversion layer 52, the first light transmissive member 53, the first dichroic mirror 54 (first layer), the second dichroic mirror 61 (second layer), and the third dichroic mirror 75, as shown in FIG. 10. The second dichroic mirror 61, the first light transmissive member 53, the first dichroic mirror 54, the wavelength conversion layer 52, and the third dichroic mirror 75 are stacked on each other in the presented order from the side on which the excitation light E is incident to form a wavelength conversion section 79.

Second Variation

A second variation will be described below with reference to FIG. 11.

Figure 11:
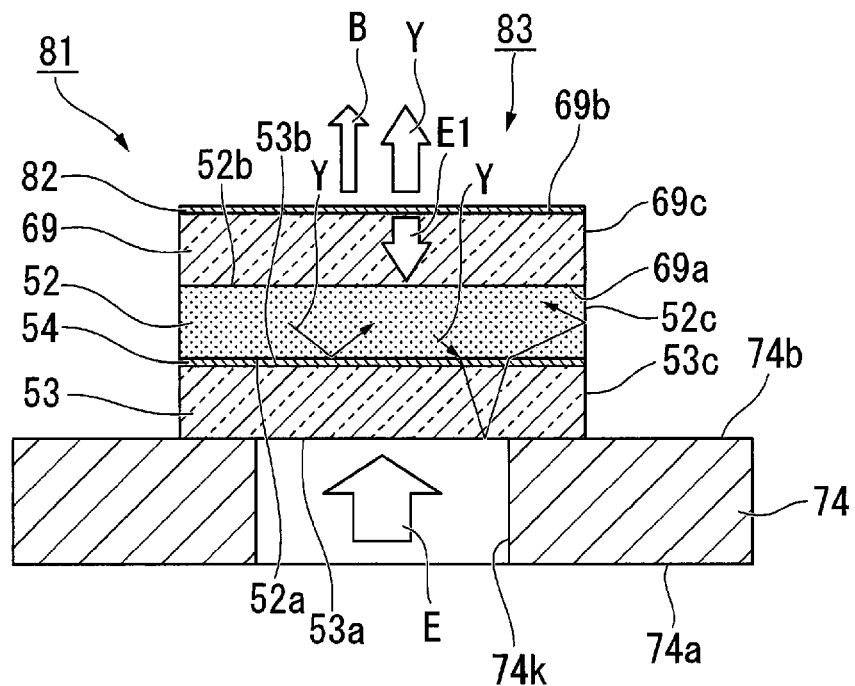
FIG. 11 is a cross-sectional view of a wavelength converter according to a second variation.

FIG. 11 is a cross-sectional view of a wavelength converter 81 according to the second variation.

In FIG. 11, components common to those in the figures used in the description of the aforementioned embodiments have the same reference characters and will not be described.

The wavelength converter 81 according to the present variation includes the first heat dissipation member 74, the wavelength conversion layer 52, the first light transmissive member 53, the second light transmissive member 69, the first dichroic mirror 54 (first layer), and a fourth dichroic mirror 82, as shown in FIG. 11. The first light transmissive member 53, the first dichroic mirror 54, the wavelength conversion layer 52, the second light transmissive member 69, and the fourth dichroic mirror 82 are stacked on each other in the presented order from the side on which the excitation light E is incident to form a wavelength conversion section 83.

The fourth dichroic mirror 82 is provided on the sixth surface 69b of the second light transmissive member 69. The fourth dichroic mirror 82 reflects the portion E1 of the excitation light E and transmits the other portion of the excitation light E as the blue light B and the florescence Y. The fourth dichroic mirror 82 is formed of a dielectric multilayer film.

Third Variation

A third variation will be described below with reference to FIG. 12.

Figure 12:
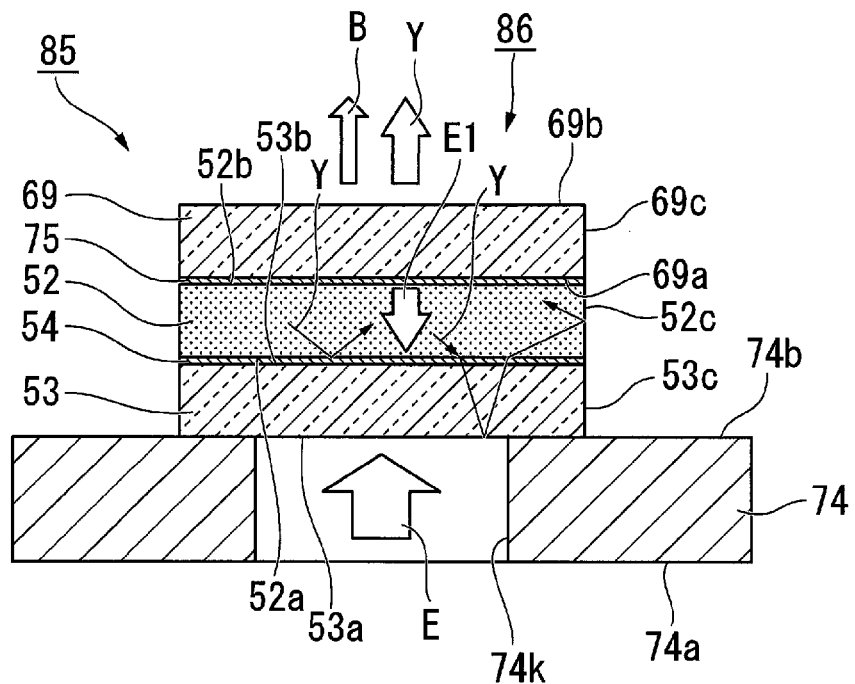
FIG. 12 is a cross-sectional view of a wavelength converter according to a third variation.

FIG. 12 is a cross-sectional view of a wavelength converter 85 according to the third variation.

In FIG. 12, components common to those in the figures used in the description of the aforementioned embodiments have the same reference characters and will not be described.

The wavelength converter 85 according to the present variation includes the first heat dissipation member 74, the wavelength conversion layer 52, the first light transmissive member 53, the second light transmissive member 69, the first dichroic mirror 54 (first layer), and the third dichroic mirror 75, as shown in FIG. 12. The first light transmissive member 53, the first dichroic mirror 54, the wavelength conversion layer 52, the third dichroic mirror 75, and the second light transmissive member 69 are stacked on each other in the presented order from the side on which the excitation light E is incident to form a wavelength conversion section 86.

Fourth Variation

A fourth variation will be described below with reference to FIG. 13.

Figure 13:
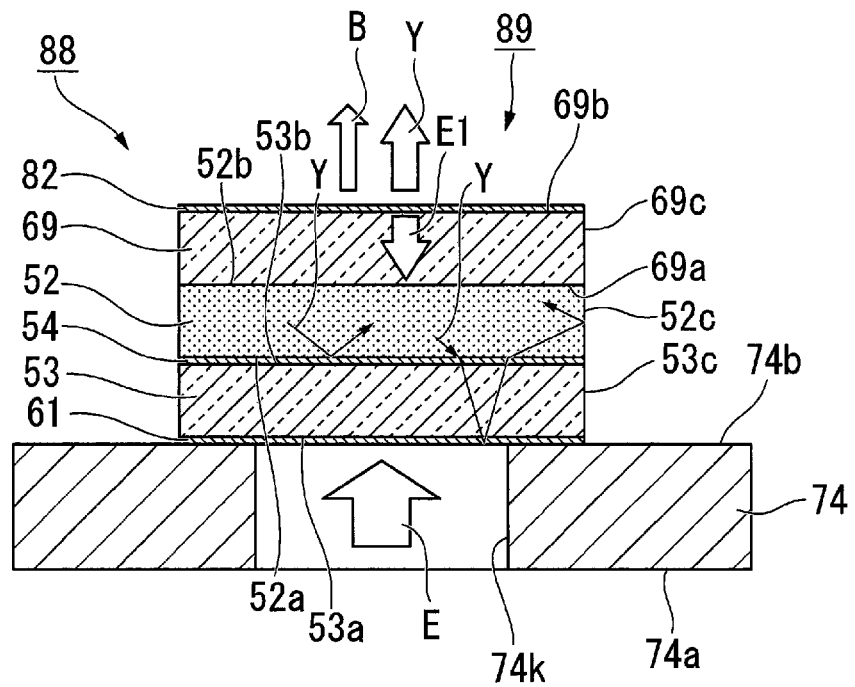
FIG. 13 is a cross-sectional view of a wavelength converter according to a fourth variation.

FIG. 13 is a cross-sectional view of a wavelength converter 88 according to the fourth variation.

In FIG. 13, components common to those in the figures used in the description of the aforementioned embodiments have the same reference characters and will not be described.

The wavelength converter 88 according to the present variation includes the first heat dissipation member 74, the wavelength conversion layer 52, the first light transmissive member 53, the second light transmissive member 69, the first dichroic mirror 54 (first layer), the second dichroic mirror 61, and the fourth dichroic mirror 82, as shown in FIG. 13. The second dichroic mirror 61, the first light transmissive member 53, the first dichroic mirror 54, the wavelength conversion layer 52, the second light transmissive member 69, and the fourth dichroic mirror 82 are stacked on each other in the presented order from the side on which the excitation light E is incident to form a wavelength conversion section 89.

Fifth Variation

A fifth variation will be described below with reference to FIG. 14.

Figure 14:
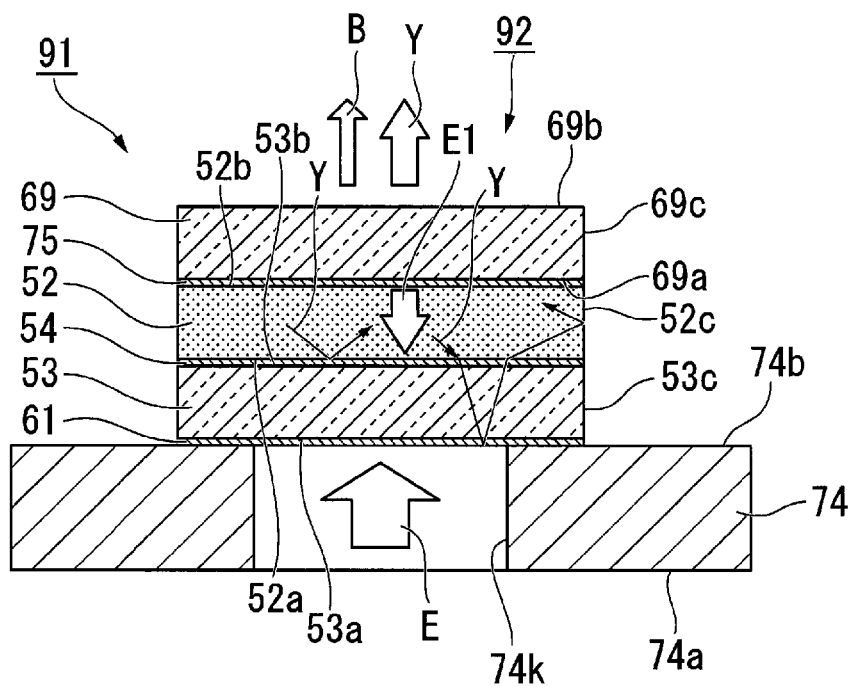
FIG. 14 is a cross-sectional view of a wavelength converter according to a fifth variation.

FIG. 14 is a cross-sectional view of a wavelength converter 91 according to the fifth variation.

In FIG. 14, components common to those in the figures used in the description of the aforementioned embodiments have the same reference characters and will not be described.

The wavelength converter 91 according to the present variation includes the first heat dissipation member 74, the wavelength conversion layer 52, the first light transmissive member 53, the second light transmissive member 69, the first dichroic mirror 54 (first layer), the second dichroic mirror 61, and the third dichroic mirror 75, as shown in FIG. 14. The second dichroic mirror 61, the first light transmissive member 53, the first dichroic mirror 54, the wavelength conversion layer 52, the third dichroic mirror 75, and the second light transmissive member 69 are stacked on each other in the presented order from the side on which the excitation light E is incident to form a wavelength conversion section 92.

Sixth Variation

A sixth variation will be described below with reference to FIG. 15.

Figure 15:
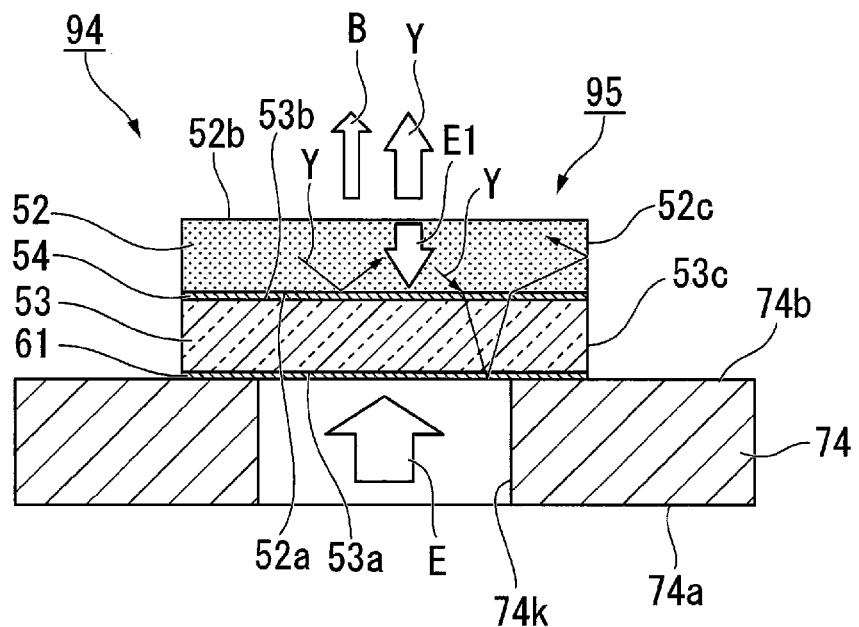
FIG. 15 is a cross-sectional view of a wavelength converter according to a sixth variation.

FIG. 15 is a cross-sectional view of a wavelength converter 94 according to the sixth variation.

In FIG. 15, components common to those in the figures used in the description of the aforementioned embodiments have the same reference characters and will not be described.

The wavelength converter 94 according to the present variation includes the first heat dissipation member 74, the wavelength conversion layer 52, the first light transmissive member 53, the first dichroic mirror 54 (first layer), and the second dichroic mirror 61, as shown in FIG. 15. The second dichroic mirror 61, the first light transmissive member 53, the first dichroic mirror 54, and the wavelength conversion layer 52 are stacked on each other in the presented order from the side on which the excitation light E is incident to form a wavelength conversion section 95.

In the sixth variation, the third dichroic mirror 75 provided in the first variation is not provided on the second surface 52b of the wavelength conversion layer 52. The wavelength converter 94 according to the present variation, which does not use the third dichroic mirror 75, therefore transmits part of the excitation light E as the blue light B.

Seventh Variation

A seventh variation will be described below with reference to FIG. 16.

Figure 16:
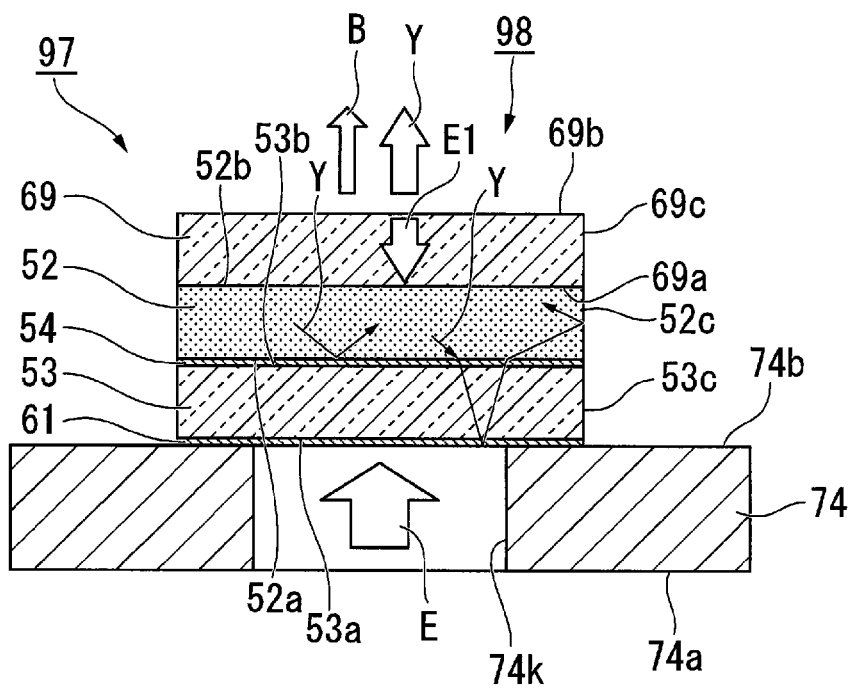
FIG. 16 is a cross-sectional view of a wavelength converter according to a seventh variation.

FIG. 16 is a cross-sectional view of a wavelength converter 97 according to the seventh variation.

In FIG. 16, components common to those in the figures used in the description of the aforementioned embodiments have the same reference characters and will not be described.

The wavelength converter 97 according to the present variation includes the first heat dissipation member 74, the wavelength conversion layer 52, the first light transmissive member 53, the second light transmissive member 69, the first dichroic mirror 54 (first layer), and the second dichroic mirror 61, as shown in FIG. 16. The second dichroic mirror 61, the first light transmissive member 53, the first dichroic mirror 54, the wavelength conversion layer 52, and the second light transmissive member 69 are stacked on each other in the presented order from the side on which the excitation light E is incident to form a wavelength conversion section 98.

In the seventh variation, the fourth dichroic mirror 82 provided in the fourth variation is not provided on the sixth surface 69b of the second light transmissive member 69. The wavelength converter 97 according to the present variation, which does not use the fourth dichroic mirror 82, therefore transmits part of the excitation light E as the blue light B.

Further, in the seventh variation, the third dichroic mirror 75 provided in the fifth variation is not provided between the second surface 52b of the wavelength conversion layer 52 and the fifth surface 69a of the second light transmissive member 69. The wavelength converter 97 according to the present variation, which does not use the third dichroic mirror 75, therefore transmits part of the excitation light E as the blue light B.

The wavelength converters 78, 81, 85, 88, 91, 94, and 97 according to the first to seventh variations described above can also provide the same effects as those provided by the wavelength converter 73 according to the fifth embodiment, such as suppression of a decrease in the efficiency at which the fluorescence Y is used, suppression of an increase in the temperature of the wavelength conversion layer 52, suppression of a decrease in the conversion efficiency of the wavelength conversion layer 52, and simplification of the apparatus configurations of the illumination apparatus 16 and the projector 1.

Eighth Variation

Out of the wavelength converters according to the embodiments and variations described above, in the wavelength converters 78, 88, 91, 94, and 97 each including the second dichroic mirror 61 may be so characterized as to transmit the excitation light E incident at an angle of incidence θ (°) that satisfies 0°<θ<θ1, reflect the excitation light E incident at an angle of incidence θ that satisfies θ1<θ<90°, and reflect the fluorescence Y. That is, the second dichroic mirror 61 may transmit the excitation light E incident at relatively small angles of incidence and reflect the excitation light E incident at relatively large angles of incidence.

Figure 17:
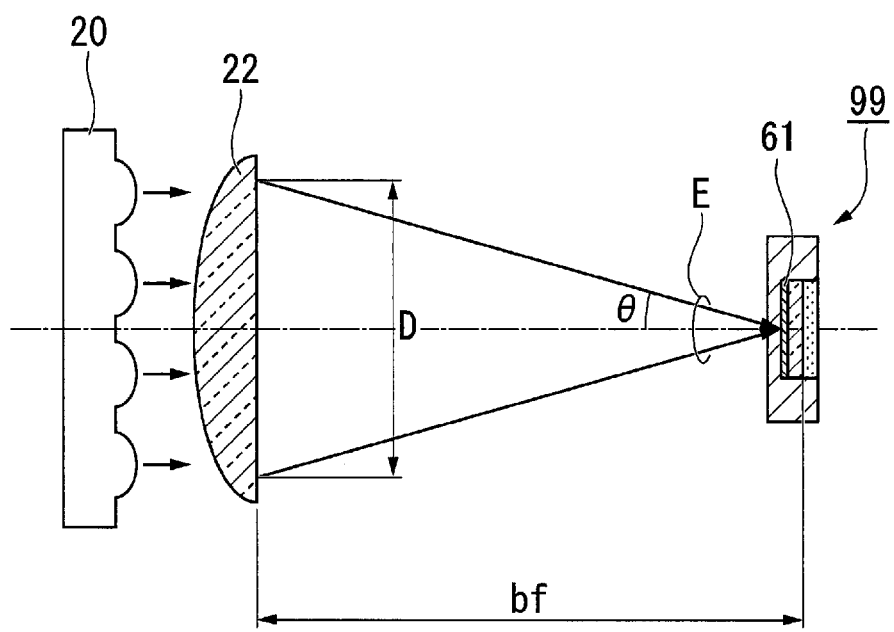
FIG. 17 describes the angle of incidence of excitation light incident on a wavelength converter according to an eighth variation.

FIG. 17 describes the angle of incidence of the excitation light E incident on a wavelength converter 99.

To use the wavelength converter 99 including the second dichroic mirror 61 having the characteristics described above, the first light source 20 and the light collection system 22 are desirably so set as to cause the excitation light E to be incident on the second dichroic mirror 61 in the wavelength converter 99 at the angle of incidence θ1, as shown in FIG. 17. To this end, the angle of incidence θ1 only needs to satisfy Expression (1):

$$\theta 1 = a\tan(0.5 \times D)/bf \tag{1}$$

where D represents the light flux width of the excitation light E that exits out of the light collection system 22, and bf represents the back focal length of the light collection system 22.

According to the configuration described above, out of the excitation light E having exited out of the light collection system 22, the excitation light E that has entered the wavelength converter 99, but has not been converted by the wavelength converter 99 into the fluorescence Y, and is about to return to the light collection system 22 can be reflected off the second dichroic mirror 61, whereby the efficiency at which the excitation light E is used can be increased. Further, since the excitation light E is allowed to make at least one round trip in the interior of the wavelength conversion layer 52, the thickness of the wavelength conversion layer 52 can be further reduced. The conversion efficiency of the wavelength conversion layer 52 can therefore be further increased.

The technical range of the present disclosure is not limited to the embodiments described above, and a variety of changes can be made thereto to the extent that the changes do not depart from the substance of the present disclosure.

For example, the aforementioned embodiments have been described with reference to a fixed wavelength converter configured not to be rotatable. The present disclosure is also applicable to a wavelength converter configured to be rotatable with a motor.

In addition to the above, the specific descriptions of the shape, the number, the arrangement, the material, and other factors of the components of the wavelength converter, the light source apparatus, and the projector are not limited to those in the embodiments described above and can be changed as appropriate. The aforementioned embodiments have been described with reference to the case where the light source apparatus according to the present disclosure is incorporated in a projector using liquid crystal light valves, but not necessarily. The light source apparatus according to the present disclosure may be incorporated in a projector using a digital micromirror device as each of the light modulators.

The aforementioned embodiments have been described with reference to the case where the light source apparatus according to the present disclosure is incorporated in a projector, but not necessarily. The light source apparatus according to the present disclosure may be used as a lighting apparatus, a headlight of an automobile, and other components.

What is claimed is:

1. A wavelength converter comprising:
a wavelength conversion layer that has a first surface and a second surface different from the first surface and converts excitation light that belongs to a first wavelength band into fluorescence that belongs to a second wavelength band different from the first wavelength band;
a first light transmissive member that has a third surface on which the excitation light is incident and a fourth surface different from the third surface and transmits at least the excitation light;
a first layer provided between the first surface of the wavelength conversion layer and the fourth surface of the first light transmissive member, which are surfaces facing each other; and
a reflection layer,
wherein
the first layer is a dichroic mirror,
the wavelength conversion layer has a first side surface that intersects the first surface and the second surface,
the first light transmissive member has a second side surface that intersects the third surface and the fourth surface,
the reflection layer is so provided as to face the first side surface and the second side surface via an air layer and reflects at least the fluorescence,
a refractive index of the first light transmissive member is greater than a refractive index of the wavelength conversion layer, and
the first layer transmits the excitation light and reflects the fluorescence.

2. The wavelength converter according to claim 1, further comprising a second layer so provided as to face the third surface of the first light transmissive member, wherein the second layer transmits the excitation light and reflects the fluorescence.

3. The wavelength converter according to claim 2, further comprising a reflection layer,
the wavelength conversion layer has a first side surface that intersects the first surface and the second surface,
the first light transmissive member has a second side surface that intersects the third surface and the fourth surface, and
the reflection layer is so provided as to face the first side surface and the second side surface and reflects at least the fluorescence.

4. The wavelength converter according to claim 1, further comprising a first heat dissipation member and a second heat dissipation member,
the reflection layer is provided between the first heat dissipation member and the first side surface of the wavelength conversion layer,
the second heat dissipation member is provided between the first heat dissipation member and the second side surface of the first light transmissive member, and
the reflection layer is provided between the first heat dissipation member and the second side surface of the first light transmissive member.

5. The wavelength converter according to claim 3, further comprising a first heat dissipation member and a second heat dissipation member,
the reflection layer is provided between the first heat dissipation member and the first side surface of the wavelength conversion layer,
the second heat dissipation member is provided between the first heat dissipation member and the second side surface of the first light transmissive member, and
the reflection layer is provided between the first heat dissipation member and the second side surface of the first light transmissive member.

6. The wavelength converter according to claim 4, further comprising a second light transmissive member that has a fifth surface and a third side surface that intersects the fifth surface and transmits at least the fluorescence,
wherein the second surface of the wavelength conversion layer and the fifth surface of the second light transmissive member are so provided as to face each other,
a third heat dissipation member is provided between the first heat dissipation member and the third side surface of the second light transmissive member, and
the reflection layer is provided between the first heat dissipation member and the third side surface of the second light transmissive member.

7. The wavelength converter according to claim 5, further comprising a second light transmissive member that has a fifth surface and a third side surface that intersects the fifth surface and transmits at least the fluorescence,
wherein the second surface of the wavelength conversion layer and the fifth surface of the second light transmissive member are so provided as to face each other, a third heat dissipation member is provided between the first heat dissipation member and the third side surface of the second light transmissive member, and the reflection layer is provided between the first heat dissipation member and the third side surface of the second light transmissive member.

8. The wavelength converter according to claim 6, wherein thermal conductivity of the second light transmissive member is greater than thermal conductivity of the wavelength conversion layer.

9. The wavelength converter according to claim 7, wherein thermal conductivity of the second light transmissive member is greater than thermal conductivity of the wavelength conversion layer.

10. The wavelength converter according to claim 6, wherein the second light transmissive member contains silicon carbide.

11. The wavelength converter according to claim 7, wherein the second light transmissive member contains silicon carbide.

12. The wavelength converter according to claim 8, wherein the second light transmissive member contains silicon carbide.

13. The wavelength converter according to claim 9, wherein the second light transmissive member contains silicon carbide.

14. The wavelength converter according to claim 1, wherein thermal conductivity of the first light transmissive member is greater than thermal conductivity of the wavelength conversion layer.

15. The wavelength converter according to claim 1, wherein the first light transmissive member contains silicon carbide.

16. A light source apparatus comprising:
    the wavelength converter according to claim 1; and
    a light source that outputs the excitation light toward the third surface of the first light transmissive member of the wavelength converter.

17. A projector comprising:
    the light source apparatus according to claim 16;
    a light modulator that modulates light from the light source apparatus in accordance with image information; and
    a projection optical apparatus that projects the light modulated by the light modulator.

18. The wavelength converter according to claim 2, wherein
    the second layer is a dichroic mirror,
    the second layer transmits the excitation light incident at an angle of incidence $\theta$ that satisfies $0°<\theta<\theta1$, reflects the excitation light incident at an angle of incidence $\theta$ that satisfies $\theta1<\theta<90°$ and reflects the fluorescence, $\theta1$ being a predetermined angle.

* * * * *